(12) United States Patent
Watanabe et al.

(10) Patent No.: US 7,902,068 B2
(45) Date of Patent: Mar. 8, 2011

(54) MANUFACTURING METHOD OF SEMICONDUCTOR DEVICE

(75) Inventors: Tadayoshi Watanabe, Kanagawa-ken (JP); Yoshiaki Shimooka, Tokyo (JP); Naofumi Nakamura, Tokyo (JP); Hayato Nasu, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 11/960,037

(22) Filed: Dec. 19, 2007

(65) Prior Publication Data
US 2008/0311742 A1 Dec. 18, 2008

(30) Foreign Application Priority Data

Dec. 19, 2006 (JP) .................................. 2006-340679

(51) Int. Cl.
*H01L 21/4763* (2006.01)
(52) U.S. Cl. ......... 438/637; 438/622; 438/625; 438/629; 438/645
(58) Field of Classification Search .................. 438/618, 438/622, 625, 626, 629, 631, 637, 638, 639, 438/642, 645, 648, FOR. 107, FOR. 109, 438/FOR. 118, FOR. 225, FOR. 227, FOR. 388, 438/FOR. 395
See application file for complete search history.

(56) References Cited

U.S. PATENT DOCUMENTS

| | | | | | |
|---|---|---|---|---|---|
| 6,064,118 | A * | 5/2000 | Sasaki | ............................ | 257/758 |
| 7,302,672 | B2 * | 11/2007 | Pack et al. | ........................ | 716/19 |
| 7,375,410 | B2 * | 5/2008 | Ho et al. | ........................ | 257/526 |
| 7,564,132 | B2 * | 7/2009 | Ohto et al. | ..................... | 257/750 |
| 2002/0160563 | A1 * | 10/2002 | Ghoshal | ....................... | 438/214 |
| 2003/0072888 | A1 * | 4/2003 | Nogami et al. | ............ | 427/430.1 |
| 2004/0175952 | A1 * | 9/2004 | Ema et al. | ..................... | 438/692 |
| 2005/0017276 | A1 * | 1/2005 | Ikushima et al. | ............ | 257/293 |
| 2005/0074968 | A1 * | 4/2005 | Chen et al. | .................... | 438/643 |
| 2005/0082165 | A1 * | 4/2005 | Sato et al. | ................ | 204/230.2 |
| 2005/0082526 | A1 * | 4/2005 | Bedell et al. | .................... | 257/52 |
| 2005/0272248 | A1 * | 12/2005 | Kloster et al. | ................ | 438/618 |
| 2006/0035457 | A1 * | 2/2006 | Carter et al. | .................. | 438/624 |

FOREIGN PATENT DOCUMENTS

JP 2001-217312 8/2001

OTHER PUBLICATIONS

J. Noguchi, et al., "Reliability of Air-Gap Cu Interconnect and Approach to Selective W Sealing using 90nm Node Technology", Proceedings of IITC, 2004, 3 Pages.

M. B. Anand, et al., "Use of Gas as Low-κ Interlayer Dielectric in LSI's: Demonstration of Feasibility", IEEE Transactions on Electron Devices, vol. 44, No. 11, Nov. 1997, pp. 1965-1971.

O. Demolliens, et al., "Copper-SiOC-AirGap Integration in a Double Level Metal interconnect", IEEE, Proceedings of IITC, 2000, pp. 276-277.

* cited by examiner

*Primary Examiner* — N Drew Richards
*Assistant Examiner* — Joannie A Garcia
(74) *Attorney, Agent, or Firm* — Oblon, Spivak, McClelland, Maier & Neustadt, L.L.P.

(57) ABSTRACT

In one aspect of the present invention, a method of fabricating a semiconductor device may include forming a sacrificial film on a substrate, forming an insulating film on the sacrificial film, forming a plurality of first openings in the sacrificial film and the insulating film in a first region and a second region, depositing a conductive material in the plurality of the first openings, forming a second opening in the insulating film in the second region so as to expose the sacrificial film, and removing the sacrificial film in the first region via the second opening in the second region.

21 Claims, 19 Drawing Sheets

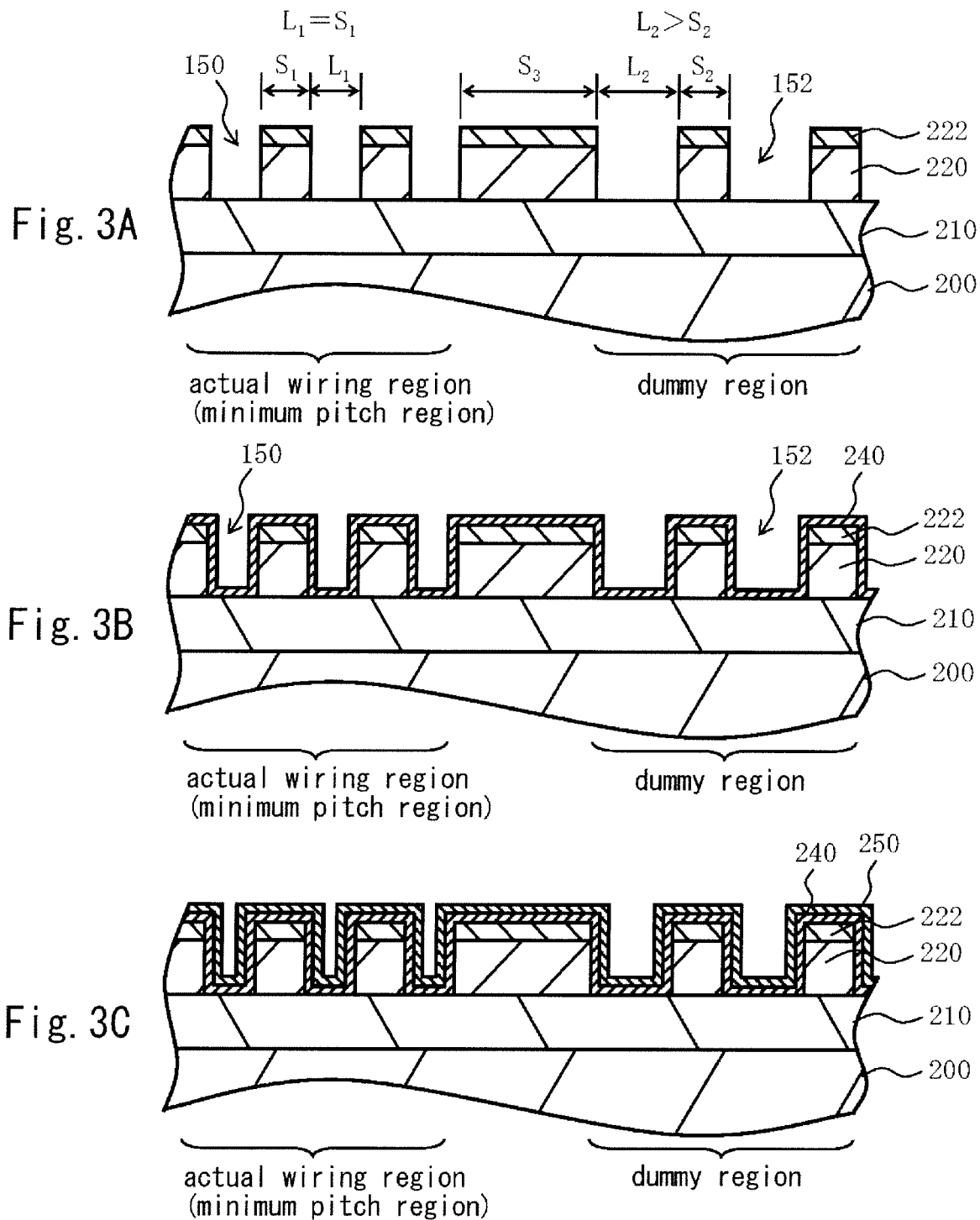

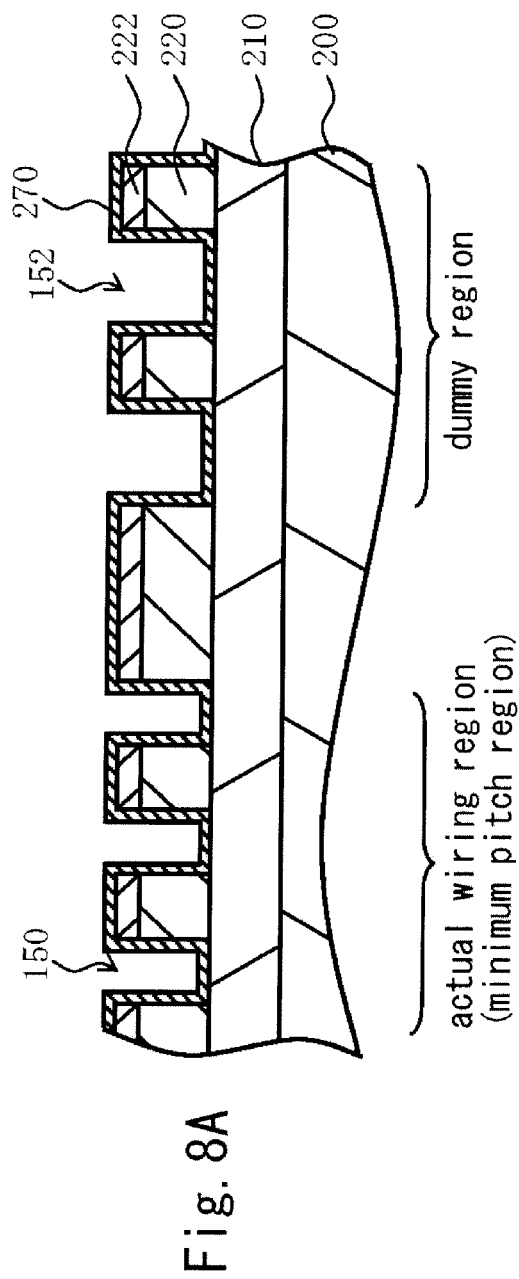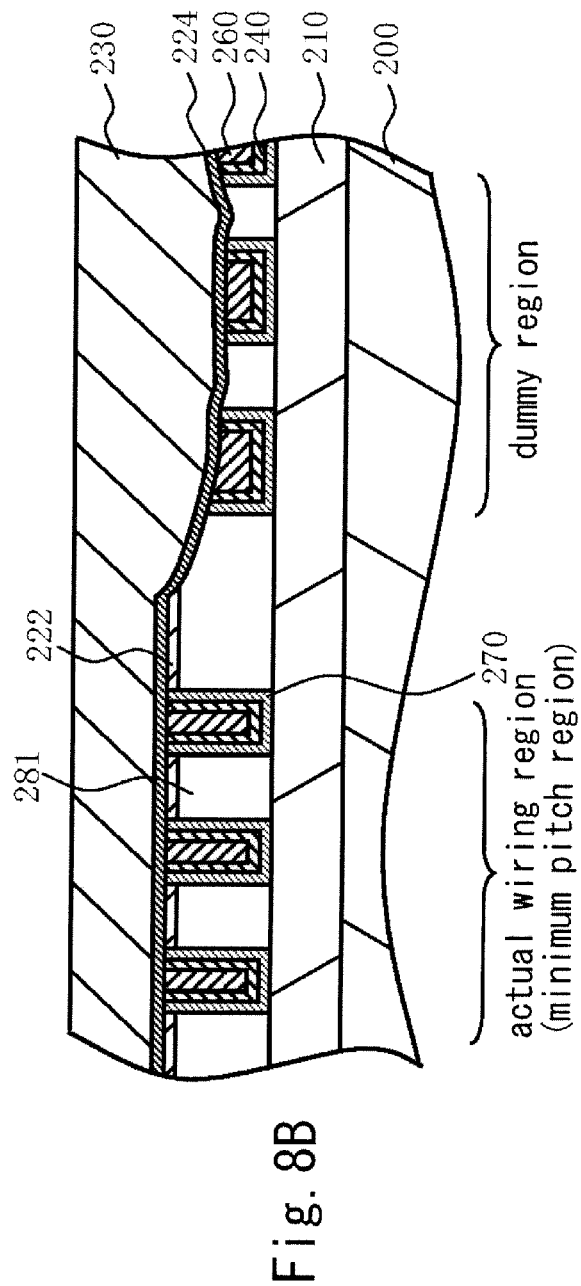

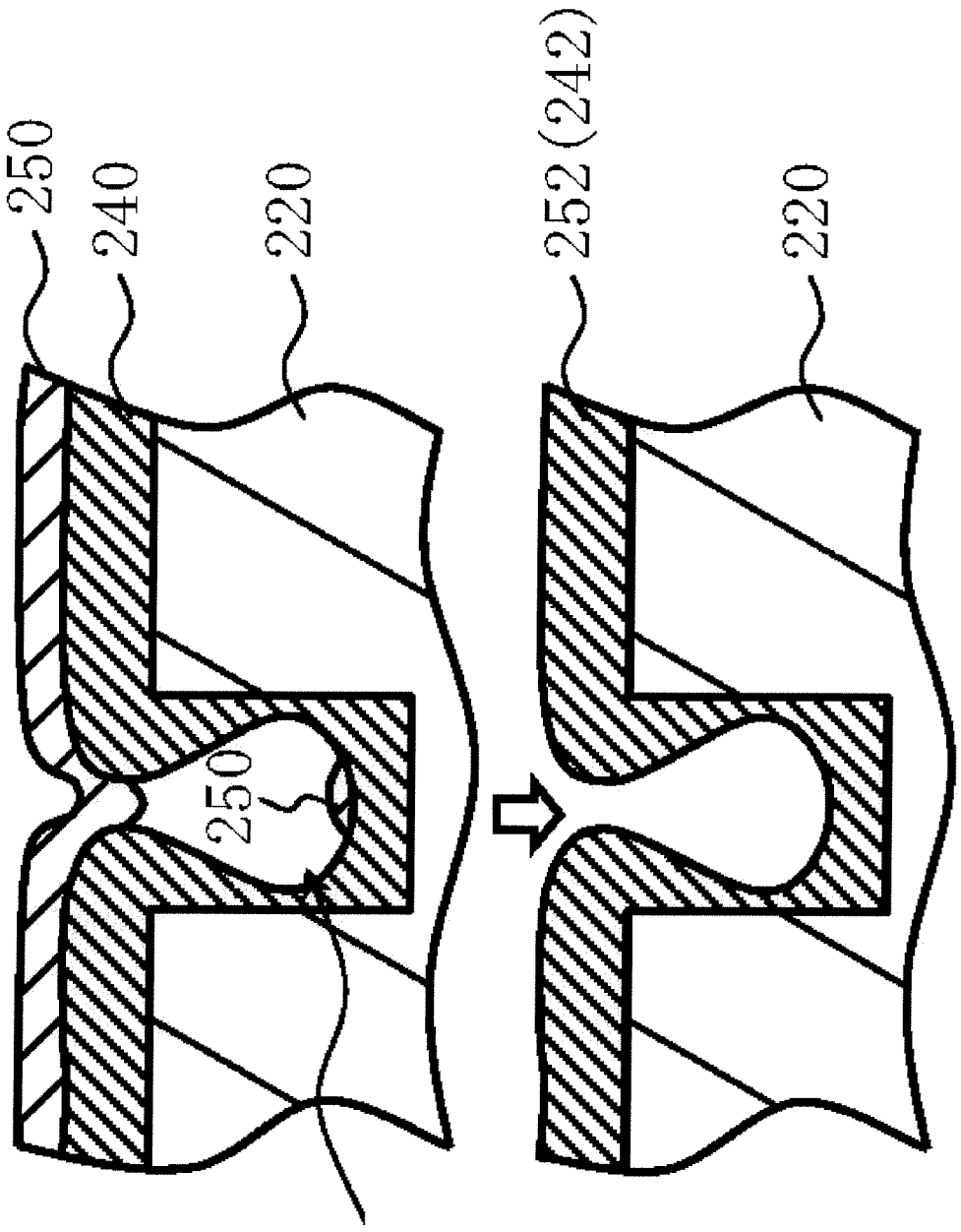

MANUFACTURING METHOD OF SEMICONDUCTOR DEVICE

CROSS REFERENCE TO RELATED APPLICATION

This application is based upon and claims the benefit of priority from Japanese Patent Application No. 2006-340679, filed on Dec. 19, 2006, the entire contents of which are incorporated herein by reference.

BACKGROUND

In recent years, a new micro-fabrication technology has been developed with the advances in the integration and in the performance of a semiconductor integrated circuit (LSI). In particular, there has been recently a progress in the movement to change a wiring material from a conventional aluminum (Al) alloy to copper (Cu) or Cu alloy (hereinafter, collectively referred to as Cu) with a low resistance in order to achieve the high-speed performance of the LSI. Since micro-fabrication of Cu is difficult with a dry etching method which is frequently used in forming an Al alloy wiring, a so-called damascene method is mainly employed for micro-fabrication of Cu. In this method, a Cu film is deposited on an insulating film on which a trench has been formed. Then, the portion of the Cu film, which is not buried in the trench, is removed with a chemical mechanical polishing (CMP) method. Thereby, a buried-Cu wiring is formed. In general, the Cu film is formed by firstly forming a thin seed layer with a sputtering method or the like, and then performing an electrolytic plating method thereon thus to form a stacked layer having a thickness on the order of several hundreds of nanometer (nm).

SUMMARY

Aspects of the invention relate to an improved method of fabricating a semiconductor device.

In one aspect of the present invention, a method of fabricating a semiconductor device may include forming a sacrificial film on a substrate, forming an insulating film on the sacrificial film, forming a plurality of first openings in the sacrificial film and the insulating film in a first region and a second region, depositing a conductive material in the plurality of the first openings, forming a second opening in the insulating film in the second region so as to expose the sacrificial film, and removing the sacrificial film in the first region via the second opening in the second region.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIGS. 3A to 3C are cross-sectional views showing the steps corresponding to those in the flowchart of FIG. 1.

FIGS. 8A and 8B are cross-sectional views showing the steps corresponding to those in the flowchart of FIG. 7.

FIGS. 11A and 11B are drawings for describing the states of the formation of the seed film in the third embodiment.

DETAILED DESCRIPTION

Figure 1:
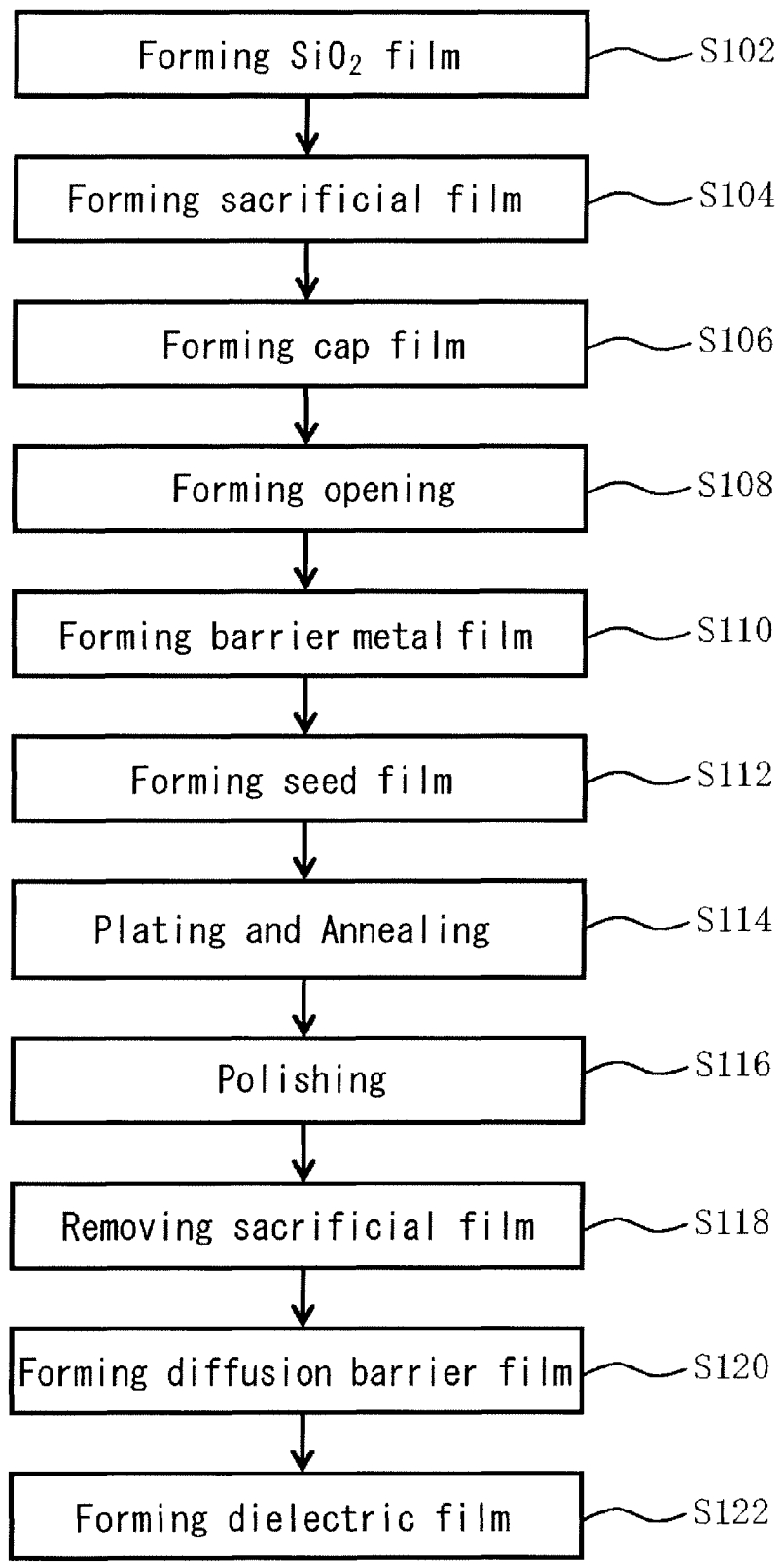
FIG. 1 is a flowchart showing the main part of a method of fabricating a semiconductor device in First embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

A first embodiment of the present invention will be explained hereinafter with reference to FIGS. 1-6.

In this first embodiment, the formation of an opening for removing a sacrificial film by utilizing the erosion resulted from the CMP will be described.

FIG. 1 is a flowchart showing the main part of a method of fabricating a semiconductor device in the first embodiment.

As shown in FIG. 1, the following series of steps are performed in the method of fabricating a semiconductor device in First embodiment: a SiO2 film forming step (S102); a sacrificial film forming step (S104); a cap film forming step (S106); an opening forming step (S108); a barrier metal film forming step (S110); a seed film forming step (S112); plating-annealing step (S114); a polishing step (S116); a sacrificial film removing step (S118); a diffusion barrier film forming step (S120); and an insulating film forming step (S122).

Figure 2A:
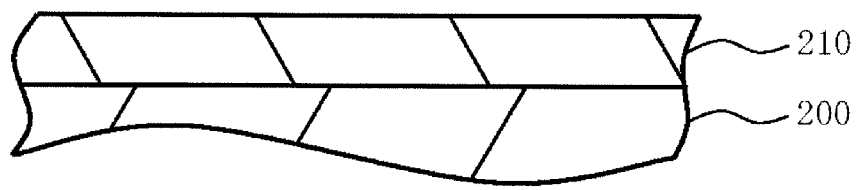
FIGS. 2A to 2C are cross-sectional views showing the steps corresponding to those in the flowchart of FIG. 1.
Figure 2B:
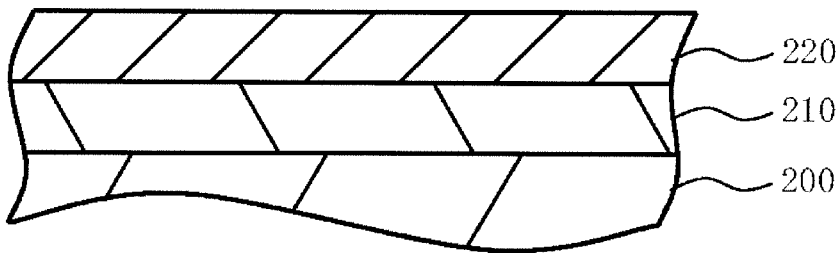
Figure 2C:
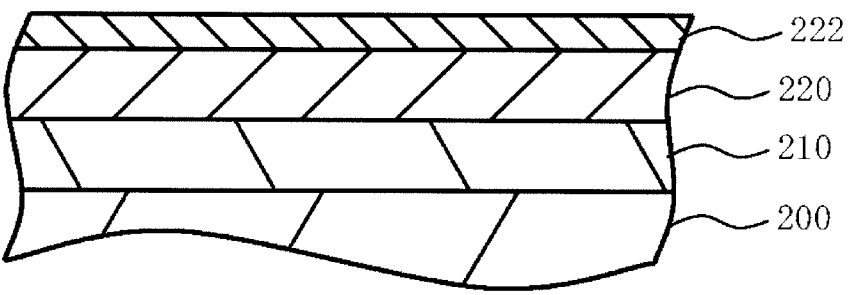

FIGS. 2A to 2C are cross-sectional views showing the steps corresponding to those in the flowchart of FIG. 1.

FIGS. 2A to 2C show the steps from the SiO2 film forming step (S102) to the cap film forming step (S106) in FIG. 1.

FIG. 2A shows the SiO$_2$ film forming step. In this step, a SiO$_2$ film 210 serving as an insulating film is formed by depositing a SiO$_2$ film having a thickness of, for example, 500 nm on the surface of a substrate 200 serving as a semiconductor substrate with a chemical vapor deposition (CVD) method. Although the CVD method is used here for forming a film, other methods may be used instead. Moreover, a silicon wafer having a diameter of 300 mm is used as the substrate 200. Here, the illustration of the device portion is omitted. Furthermore, the substrate 200 may be provided with a layer formed thereon, the layer having various kinds of semiconductor elements or structure such as a metal wiring or a contact plug (unillustrated). Alternatively, other layers may be formed thereon.

FIG. 2B shows the sacrificial film forming step. In this step, an organic film 220 containing carbon (C) as the main component is formed with a thickness of, for example, 200 nm on the SiO$_2$ film 210. As the material of the organic film 220, for example, polyarylene ether (PAr) is suitably used. The organic film 220 functions as a sacrificial film which is to be removed to form an air gap in the subsequent step.

FIG. 2C shows the cap film forming step. In this step, a thin SiOC film 222 is formed by depositing silicon oxycarbide (SiOC) serving as a cap insulating film with a thickness of, for example, 50 nm on the organic film 220 with the CVD method. The cap film may be formed using, as the material of the cap film, at least one kind of insulating material, having a relative dielectric constant of 2.5 or more, selected from the group consisting of SiOC as well as SiO2, silicon carbide (SiC), silicon carbohydride (SiCH), silicon carbonitride (SiCN), and SiOCH. Although the CVD method is used here for forming a film, other methods may be used instead.

FIGS. 3A to 3C are cross-sectional views showing the steps corresponding to those in the flowchart of FIG. 1.

FIGS. 3A to 3C show the steps from the opening forming step (S108) to the seed film forming step (S112) in FIG. 1.

FIG. 3A shows the opening forming step. In this step, a plurality of openings 150 and 152 (first openings) are formed in the SiOC film 222 and the sacrificial film 220 by performing a lithography process and a dry etching process, the openings 150 and 152 having wiring trench structures for producing a damascene wiring. The openings 150 and 152 can be formed as follows. An anisotropic etching method is performed on the substrate 200 having a resist film formed on the SiOC film 222 through an unillustrated resist coating process and lithography process such as an exposure process to remove the exposed SiOC film 222 and the sacrificial film 220 located therebelow. The openings 150 and 152 are approximately vertical to the surface of the substrate 200. As an example, a reactive ion etching method may be used to form the openings 150 and 152. Here, the opening 150 is formed in an actual wiring region so that a line (wire) width L1 and a space width S1 can be provided at the minimum dimensional pitch ratio of 1:1 in the dimension of a desired pattern. On the other hand, a dummy wiring region (dummy region) is formed in a position spaced apart from the actual wiring region by a distance of S3. The opening 152 is formed in the dummy wiring region (dummy region) at the wiring pitch where a line (wire) width L2 and a space width S2 satisfy the relation of L2>S2. In other words, the opening 152 is formed so that, when a Cu film is buried in the opening 152, the opening coverage of the Cu film can be more than 50%, and that the wiring pitch of the dummy wiring formed of the Cu film buried in the opening 152 can be L2+S2 which is larger than the minimum wiring pitch L1+S1 in the actual wiring region. The space widths S1 and S2 are here preferably formed so as to satisfy the relation of S1≦S2 when the line width L1 and the space width S1 are formed in the minimum dimensions allowing lithographic manufacturing. The distance S3 is desirably, for example, within 10 μm, and desirably has a dimension so that does not allow the erosion resulting from the polishing step described below to extend to the actual wiring region.

FIG. 3B shows the barrier metal film forming step. In this step, a barrier metal film 240 is formed, using a barrier metal material which serves as a conductive material, on the surfaces of the openings 150 and 152 which have been formed in the opening forming step, and on the surface of the SiOC film 222. A thin tantalum (Ta) film is deposited with a thickness of, for example, 10 nm using a sputtering method that is one of physical vapor deposition (PVD) methods thereby to form the barrier metal film 240. A method of depositing a barrier metal material is not limited to the PVD method. An atomic layer deposition (ALD) method, atomic layer chemical vapor deposition (ALCVD) method, CVD method, or the like can be used instead. The use of the PVD method can lead to the improvement in the coverage. The barrier metal film may be a stacked film formed using, as the material of the barrier metal film, tantalum-based tantalum-containing substances such as tantalum nitride (TaN) in addition to Ta, titanium-based titanium-containing substances such as titanium nitride (TiN) in addition to Ti, tungsten-based tungsten-containing substances such as tungsten nitride (WN), or the combination such as Ta and TaN.

FIG. 3C shows the seed film forming step. In this step, a thin Cu film, serving as a cathode electrode in the subsequent electrolytic plating step, is deposited (formed) as a seed film 250 on the surfaces of the inner walls of the openings 150 and 152 and the substrate 200, on which the barrier metal film 240 has been formed, with the PVD method such as the sputtering method. The seed film 250 is here deposited with a thickness of, for example, 50 nm on the surface of the substrate 200 or the like.

Figure 4A:
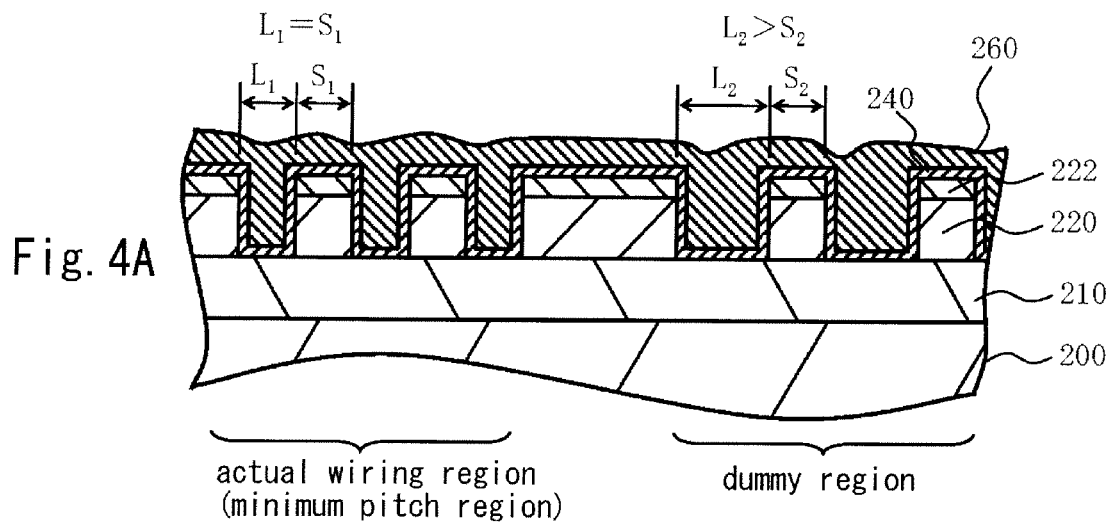
FIGS. 4A to 4C are cross-sectional views showing the steps corresponding to those in the flowchart of FIG. 1.
Figure 4B:
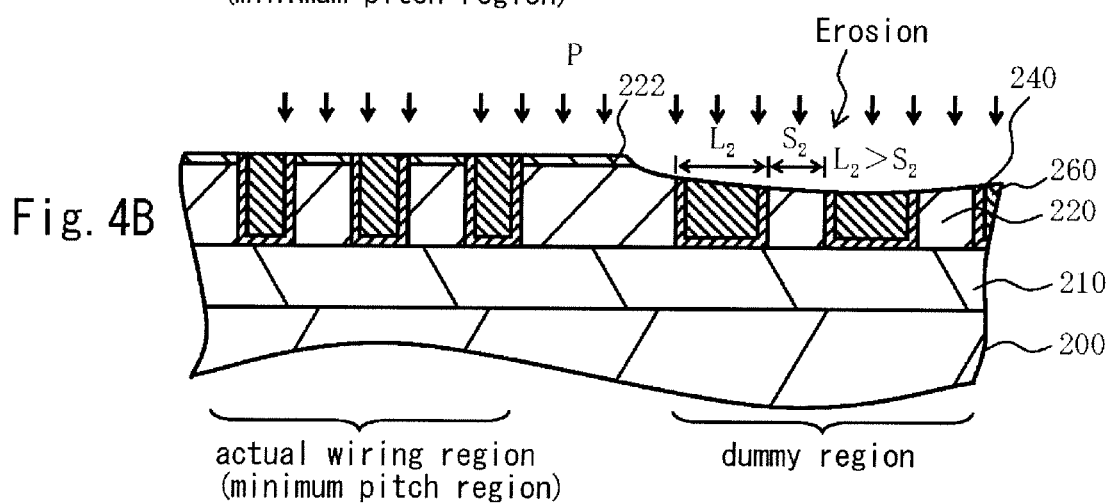
Figure 4C:
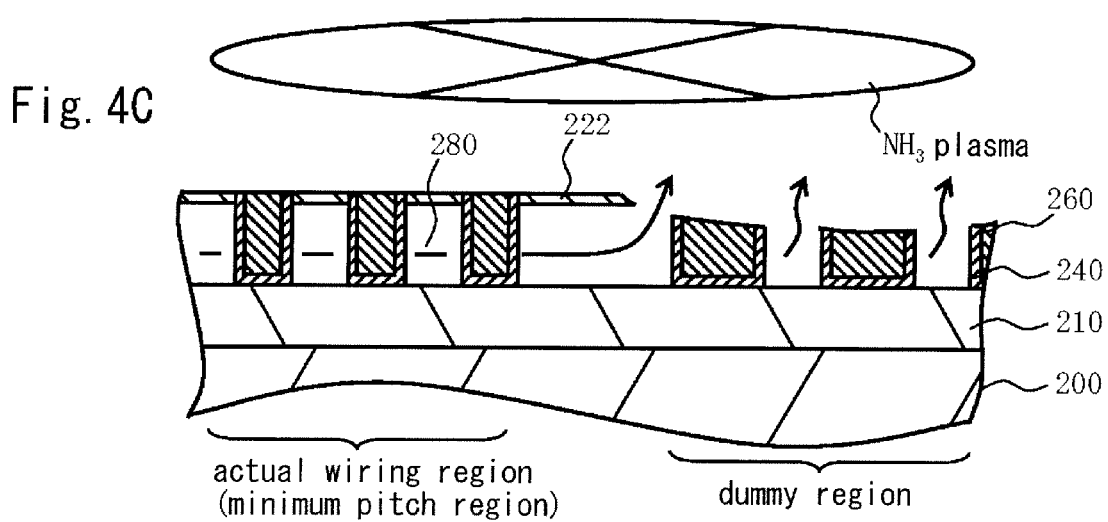

FIGS. 4A to 4C are cross-sectional views showing the steps corresponding to those in the flowchart of FIG. 1.

FIGS. 4A to 4C show the steps from the plating-annealing step (S114) to the sacrificial film removing step (S118) in FIG. 1.

FIG. 4A shows the plating step. In this step, a Cu film 260 which serves as a conductive material is deposited in the openings 150 and 152 and on the surface of the resulting substrate 200 through an electrochemical deposition method with electrolytic plating using the seed film 250 as the cathode electrode. The deposited Cu film 260 has a thickness of, for example, 800 nm. Then, the deposited film is subjected to the anneal step at, for example, 250° C. for 30 minutes.

FIG. 4B shows the polishing step. In this step, the surface of the substrate 200 is polished with the CMP method applying a polishing load P thereby to remove the Cu film 260 including the seed film 250 and the barrier metal film 240, which are deposited on the surface other than the area of the openings, and which serve as a wiring layer. Since the coverage does not exceed 50% in the actual wiring region, the planarization can be accomplished as shown in FIG. 4B. Thus, a damascene wiring can be formed. On the other hand, in the dummy wiring region (dummy region), since the coverage exceeds 50%, the erosion can be caused.

Figure 5:
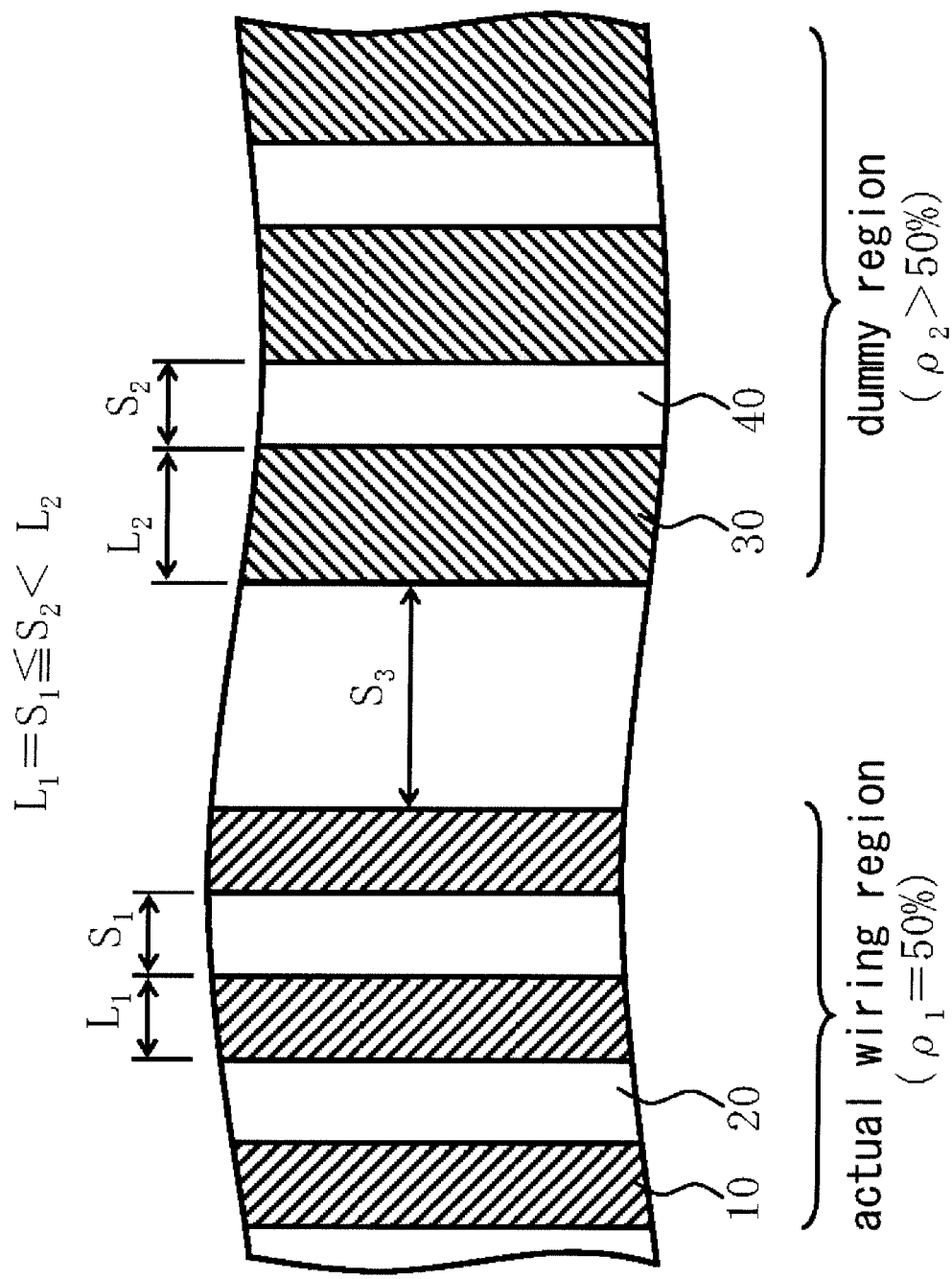
FIG. 5 is a top view of an example of a wiring pattern in First embodiment.

FIG. 5 is a top view of an example of a wiring pattern in First embodiment.

As shown in FIG. 5, the wiring pattern is formed so that a wiring 10 and a space 20 are formed at the minimum dimensional pitch ratio of 1:1 in the actual wiring region. Accordingly, in this example, the coverage ρ1 is 50%. On the other hand, in the dummy wiring region (dummy region), the wiring pattern is formed so that the line width L2 of a wiring 30 can be larger than the space width S2 of a space 40. Accordingly, in this example, the coverage ρ2 exceeds 50%. In this case, after the CMP process is performed, the erosion occurs in the dummy wiring region (dummy region) where the coverage exceeds 50%. Therefore, in the first embodiment, the wiring pattern is formed so that the erosion can occur in the dummy wiring region (dummy region) which is different from the actual wiring region where the wiring is formed at the minimum dimensional pitch. In this way, erosion can be caused only in a desired small region. Furthermore, in addition to the Cu film 260 and the barrier metal film 240, the SiOC film 222 in the dummy wiring region (dummy region) is removed by the polishing. As a result, the sacrificial film 220 can be exposed in and around the dummy wiring region (dummy region). Thus, an opening (second opening) can be formed in the region of SiOC film 222 where the erosion has occurred. When the line width L2 of the wiring 30 in the dummy wiring region (dummy region) is significantly large, the wiring 30 may be formed in an isolated pattern. In this case, the sacrificial film 220 can be exposed around the wiring in the dummy wiring region (dummy region).

FIG. 4C shows the sacrificial film removing step. In this step, the substrate 200 on which the sacrificial film 220 is exposed in the dummy wiring region (dummy region) is exposed to ammonia ($NH_3$) plasma ambient. The sacrificial film 220 can thereby be removed via the opening formed in the SiOC film 222 in and around the dummy wiring region (dummy region) As a result, in the actual wiring region, an air gap 280 is formed under the SiOC film 222 which serves as a cap film. In this respect, in performing the plasma treatment, oxygen ($O_2$) plasma or nitrogen ($N_2$)/hydrogen ($H_2$) plasma may be preferably used in place of the $NH_3$ plasma. It is only necessary to form an ambient capable of removing the sacrificial film 220. If the wiring pattern is laid out so that radicals activated by the plasma can run round the sacrificial film 220 located in various positions, the sacrificial film 220 located in a region apart from the opening in the SiOC film 222 can be removed. In other words, it is preferable to lay out the wiring pattern in which the sacrificial film 220 is not completely cut off by the wiring material from the position of the opening, the position also including the actual wiring region. In such a way, the removal is initiated at the opening formed in the SiOC film 222. Thus, the sacrificial film 220 can be removed not only in the dummy wiring region (dummy region) but also in the actual wiring region. The sacrificial film 220 can be removed as compared to a conventional manufacturing process where a sacrificial film is removed by causing the sacrificial film to penetrate through uncertain cavity or opening in a film. Therefore, it is possible to remove the sacrificial film 220 in the actual wiring region where the wirings are formed at the minimum dimension pitch to reduce the wiring capacitance.

Since the SiOC film 222 which serves as the cap film is formed in the actual wiring region, the SiOC film 222 is connected to and supported by the plurality of wirings from the sides of each of the wirings. Here, the SiOC film 222 is connected to the upper side surfaces of the barrier metal film 240. Accordingly, the SiOC film 222 functions as a protection film, and prevents the wirings from falling down, even when the space under the SiOC film 222 becomes vacant, allowing the mechanical strength to be maintained.

Figure 6A:
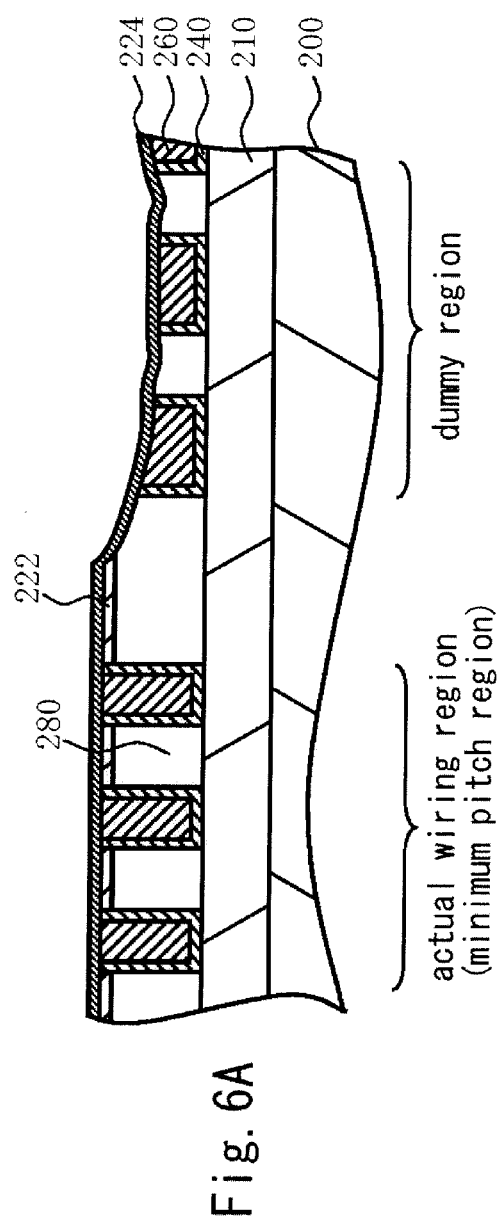
FIGS. 6A and 6B are cross-sectional views showing the steps corresponding to those in the flowchart of FIG. 1.
Figure 6B:
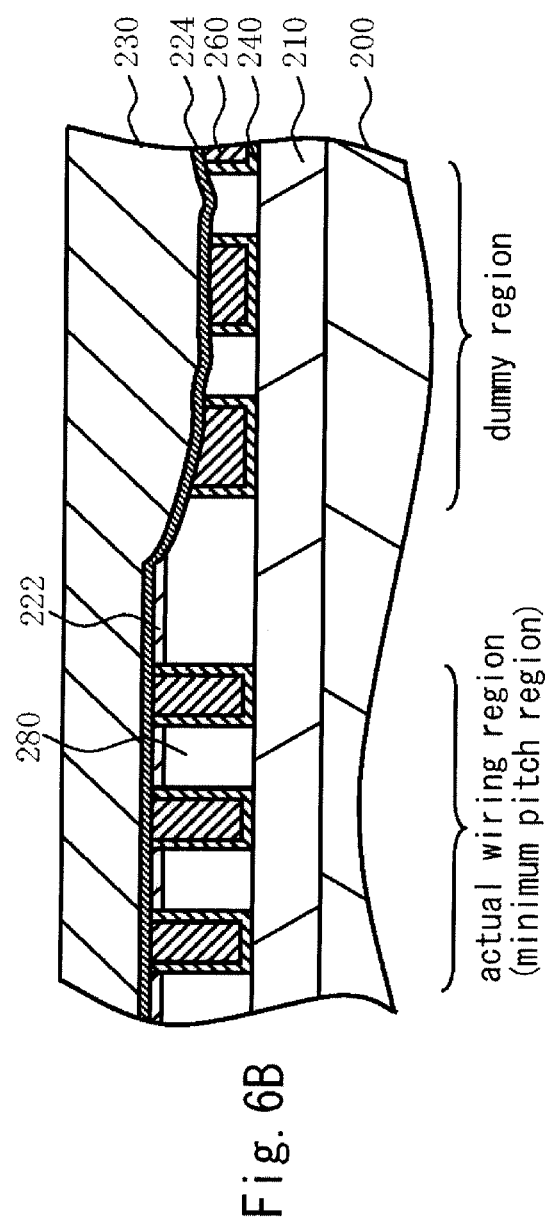

FIGS. 6A and 6B are cross-sectional views showing the steps corresponding to those in the flowchart of FIG. 1.

FIGS. 6A and 6B show the steps of the diffusion barrier film forming step (S120) and the insulating film forming step (S122) in FIG. 1.

FIG. 6A shows the diffusion barrier film forming step. In this step, a diffusion barrier film 224 is formed on the resulting substrate 200 by reducing the coverage with the CVD method. This film can cover the uppermost part of the dummy wiring region (dummy region) as a mask for the space of the opening in the region. As a result, the air gap 280 can also be formed in the dummy wiring region (dummy region). By forming the diffusion barrier film 224 on the Cu film 260, the Cu can be prevented from diffusing to an insulating film on the top thereof. The material of the diffusion barrier film 224 preferably includes, for example, SiC.

FIG. 6B shows the insulating film forming step. In this step, a thin insulating film 230, which serves as an interlayer insulating film on the top layer, is formed with a thickness of, for example, 100 nm on the diffusion barrier film 224. As the material of the insulating film 230, for example, a porous insulating material with a low dielectric constant is preferably used. By forming the insulating film 230, the interlayer insulating film with a relative dielectric constant k of less than 3.5 can be obtained. Here, the insulating film 230 is formed by using, as an example, an LKD (Low-K Dielectric material: available from JSR Corporation) with polymethylsiloxane of a low dielectric constant insulating material having a relative dielectric constant of less than 2.5. As the forming method of the insulating film 230, for example, an SOD (spin on dielectric coating) method in which a thin film is formed by spin-coating and then drying a solution can be used. As the material of the insulating film 230, at least one kind selected from the group consisting of, for example: a film having a siloxane skeleton including polysiloxane, hydrogen silsesquioxane and methylsilsesquioxane; an organic film containing, as a main component, an organic resin such as polyarylene ether (PAr), polybenzoxazole, polybenzocyclobutene; and a porous film such as a porous silica film, in addition to polymethylsiloxane, may be used to form the insulating film 230. Using such materials for the insulating film 230, a low dielectric constant insulating film having a relative dielectric constant of less than 2.5 can be obtained. The forming method is not limited to the SOD method. A CVD method may preferably be used.

As described above, in the first embodiment, the opening for removing the sacrificial film 220 can be formed without increasing the number of steps by using the CMP method to polish the conductive material such as the Cu film 260 and the SiOC film 222 serving as the cap film. In particular, the air gap can be formed without affecting the form of the actual wirings by causing the erosion in the dummy wiring region (dummy region) that has no influence on the performance of the device. In this structure, the capacitance between wirings can be reduced by removing the sacrificial film 220 which is the organic insulating film. The formation of the air gap prevents the barrier metal from being corroded due to a damaged layer in the low dielectric constant film which absorbs moisture. Furthermore, it is possible to prevent the increase in the leakage due to the diffusion of the wiring material into the vacancies in the low dielectric constant film, thus preventing the dielectric breakdown.

Second Embodiment

A second embodiment is explained with reference to FIGS. 7-8B.

In the second embodiment, a configuration in which a film is added to reinforce the Cu wiring which loses the support due to the formation of an air gap will be described.

Figure 7:
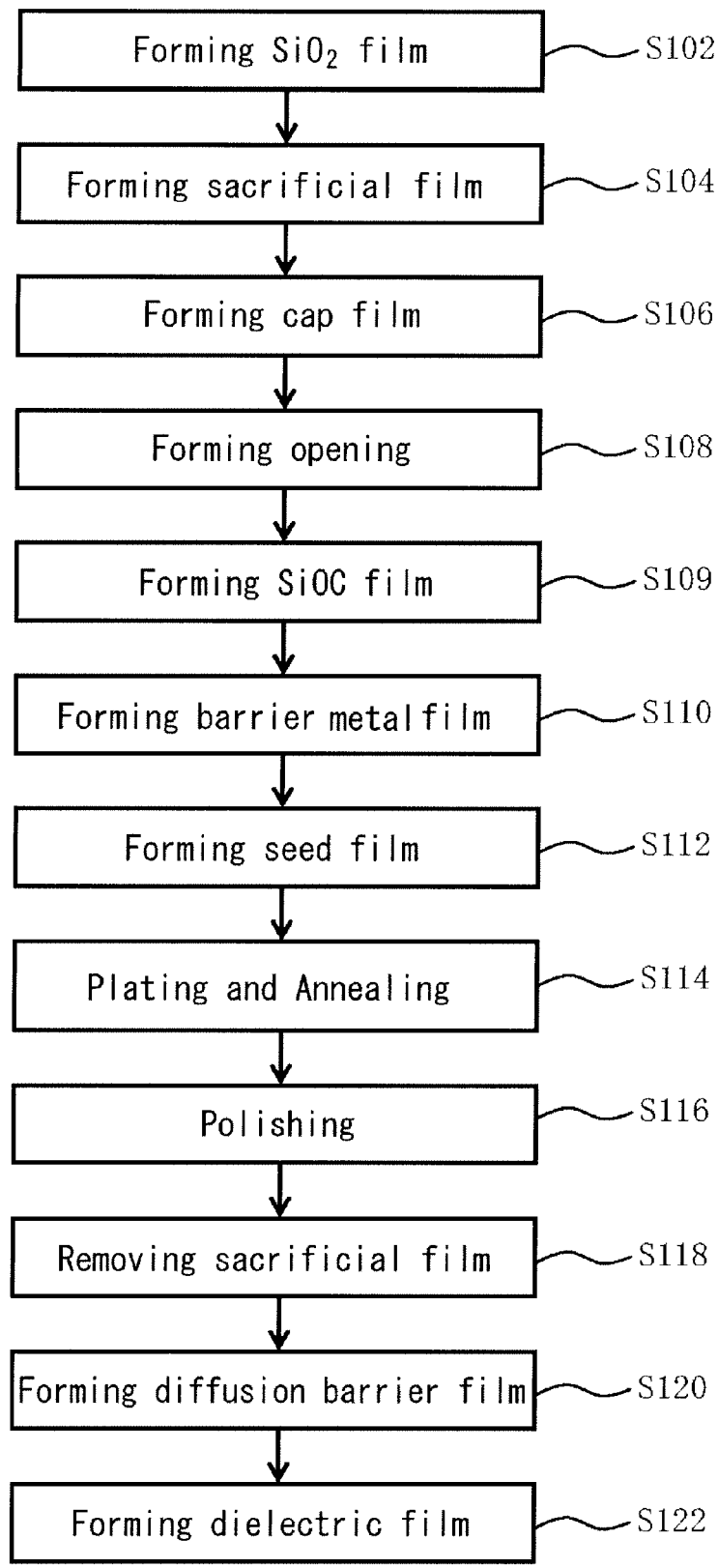
FIG. 7 is a flowchart showing the main part of a method of fabricating a semiconductor device in Second embodiment.

FIG. 7 is a flowchart showing the main part of a method of fabricating a semiconductor device in the second embodiment.

FIG. 7 is the same as FIG. 1 except that a SiOC film forming step (S109) is added between the opening forming step (S108) and the barrier metal film forming step (S110). Thus, the steps from the SiO2 film forming step (S102) to the opening forming step (S108) are the same as those in FIG. 1.

FIGS. 8A and 8B are cross-sectional views showing the steps corresponding to those in the flowchart of FIG. 7.

FIGS. 8A and 8B are the cross-sectional views showing the SiOC film forming step (S109), and the cross-sectional view seen when the insulating film forming step (S122) has been completed in FIG. 7.

FIG. 8A shows the SiOC film forming step. In this step, a SiOC film 270 having a relative dielectric constant k of 2.5 is formed on the bottom and side surfaces of the openings 150 and 152, and on the surface of the SiOC film 222 shown in FIG. 3A by using the CVD method. The SiOC film 270 formed on the bottom surfaces of the openings 150 and 152, and on the surface of the SiOC film 222 is removed with an anisotropic etching method as necessary.

Subsequently, the series of steps from the barrier metal film forming step (S110) to the insulating film forming step (S122) are performed as in First embodiment. By performing these steps, a Cu wiring structure can be formed in which an air gap 281 shown in FIG. 8B is formed. In Second embodiment, the SiOC film 270 is formed on the side and bottom surfaces of the Cu film 260 with the barrier metal film 240 in between. As a result, the effect of reinforcing the wiring by the SiOC film 270 which serves as the reinforcement film can be obtained in addition to the effects of the first embodiment. Moreover, by forming the SiOC film 270 made of the same material as that of the SiOC film 222 serving as the cap film, the SiOC film 270 is bound to the SiOC film 222, and thereby the mechanical strength is improved. In addition, by forming the SiOC film 270 having a relative dielectric constant k of 2.5, the increase in the wiring capacitance can be reduced as compared to the use of the other film having a high dielectric constant.

Third Embodiment

A third embodiment is explained with reference to FIGS. 9-11B.

Figure 9:
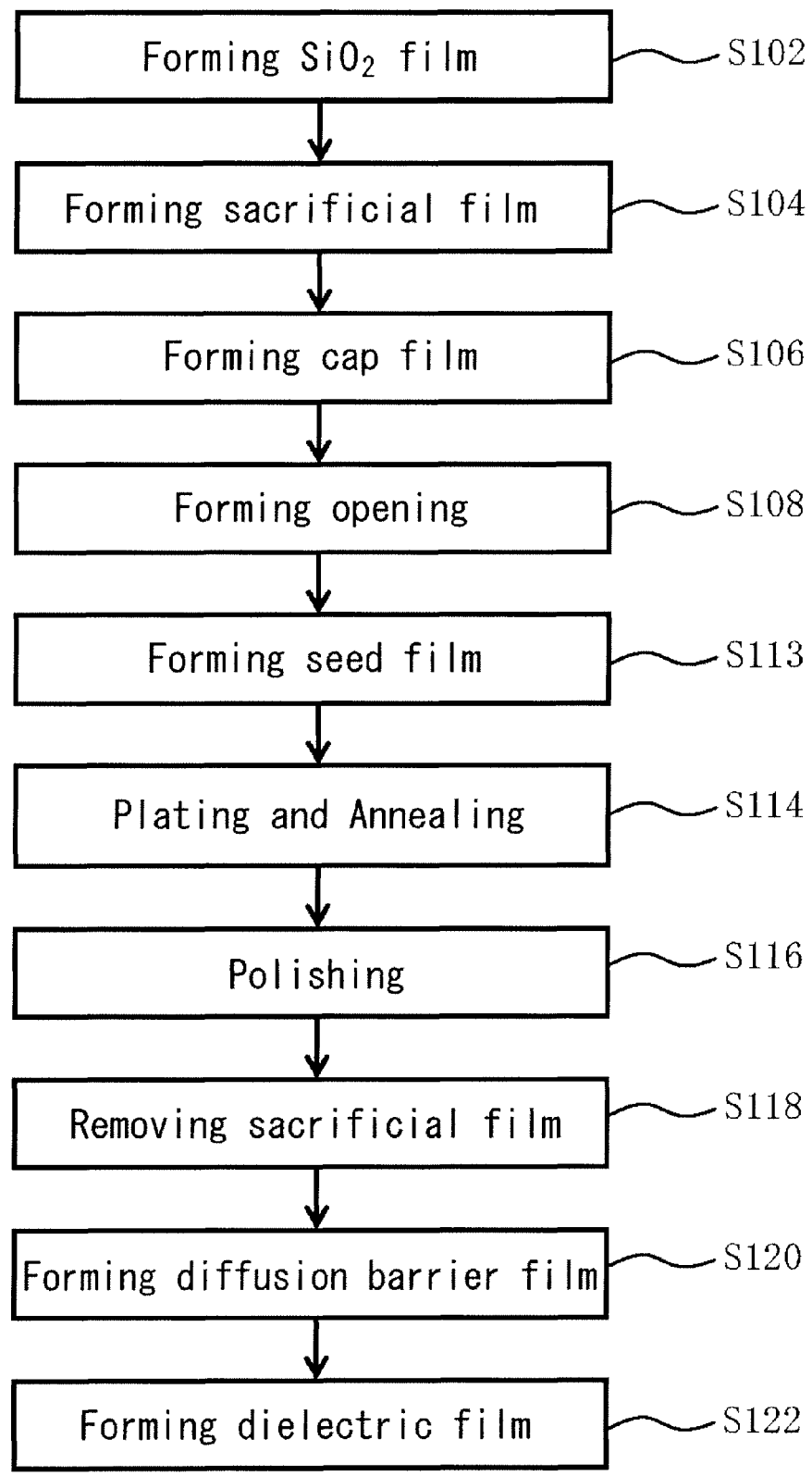
FIG. 9 is a flowchart showing the main part of a method of fabricating a semiconductor device in the third embodiment.

FIG. 9 is a flowchart showing the main part of a method of fabricating a semiconductor device in the third embodiment.

FIG. 9 is the same as FIG. 1 except that the barrier metal film forming step (S110) is eliminated, and that a seed film forming step (S113) is added in place of the seed film forming step (S112). Thus, the steps from the SiO2 film forming step (S102) to the opening forming step (S108) is the same as those in the first embodiment.

Figure 10A:
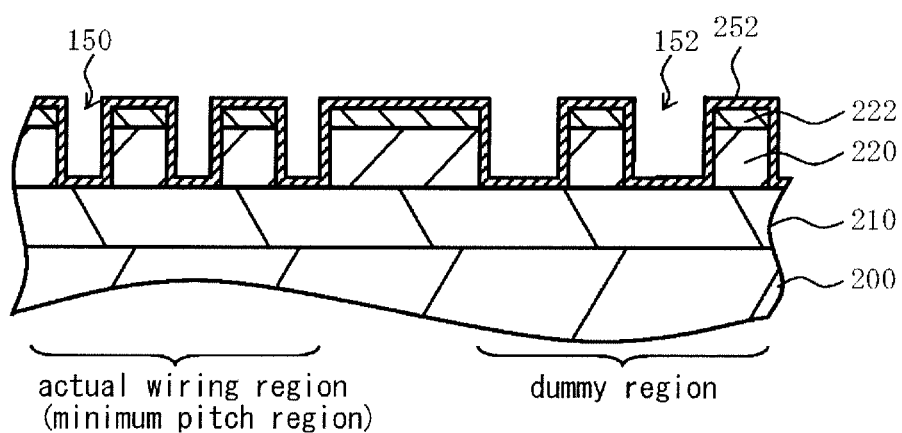
FIGS. 10A to 10C are cross-sectional views showing the steps corresponding to those in the flowchart of FIG. 9.
Figure 10B:
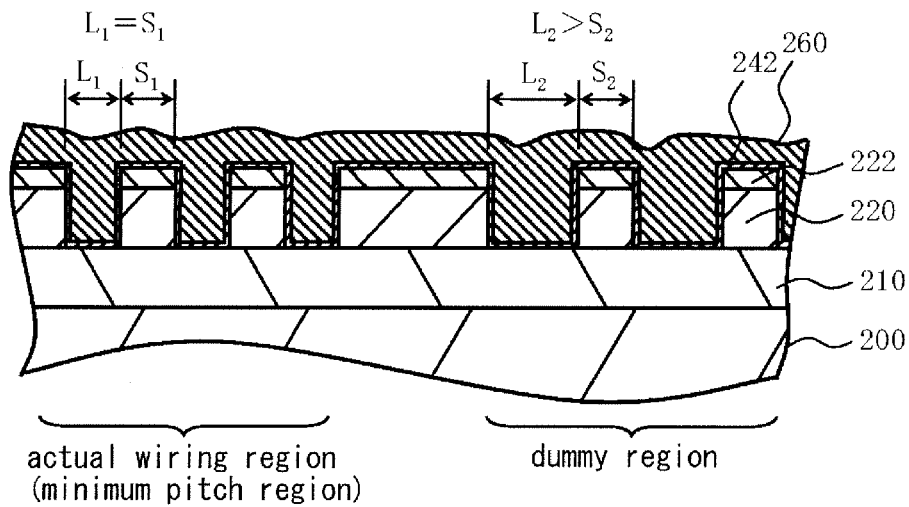
Figure 10C:
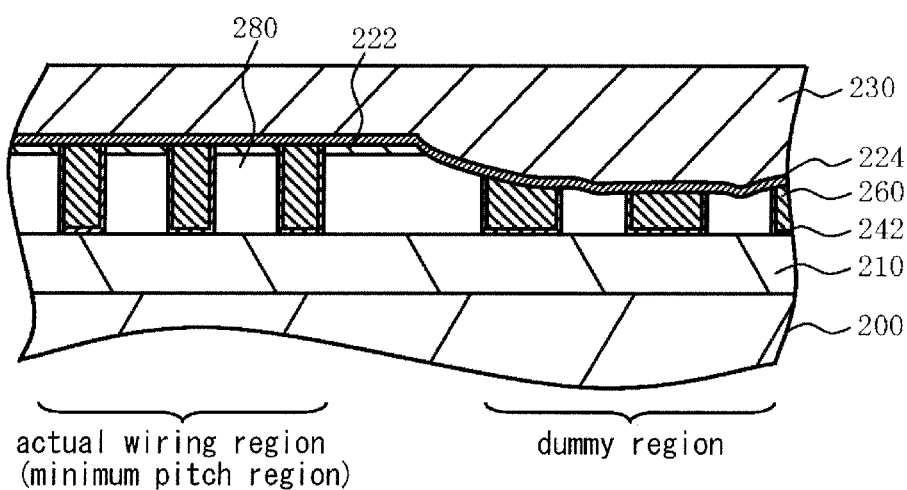

FIGS. 10A to 10C are cross-sectional views showing the steps corresponding to those in the flowchart of FIG. 9.

FIGS. 10A to 10C are the cross-sectional views showing the steps from the seed film forming step (S113) to the plating-annealing step (S114), and the cross-sectional view seen when the insulating film forming step (S122) has been completed in FIG. 9.

FIG. 10A shows the seed film forming step. In this step, a thin Cu film which functions as a cathode electrode in the subsequent electrolytic plating step is deposited (formed) as a seed film 252 on the bottom and side surfaces of the openings 150 and 152, and on the surface of the SiOC film 222 shown in FIG. 3A with the PVD method such as the sputtering method, in addition to the state shown in FIG. 3A. A Cu seed film containing a manganese (Mn) alloy is here used as the seed film 252.

FIG. 10B shows the plating step. In this step, the Cu film 260 serving as a conductive material is deposited in the openings 150 and 152, and on the surface of the substrate 200 through an electrochemical deposition method with electrolytic plating using the seed film 252 as the cathode electrode. The deposited Cu film 260 has a thickness of, for example, 800 nm. Then, the deposited film is subjected to the annealing step at, for example, 250° C. for 30 minutes. By performing the annealing step, the Mn contained in the seed film 252 is diffused into the wall of the insulating film, and then the Mn is bound to the silicon (Si) and oxygen (O) to form MnSixOy. The silicon and oxygen can be supplied from the SiOC film 222. The self-formed MnSixOy serves as a barrier metal film 242. Therefore, the barrier metal film forming step prior to the seed film forming step can be eliminated in the third embodiment.

The SiOC film 222 is used as a cap film in the third embodiment. However, the cap film is not limited to the SiOC film 222. For example, SiO2 is also preferably used as the material of the cap insulating film in addition to SiOC.

Thereafter, the series of steps from the polishing step (S116) to the insulating film forming step (S122) are performed as in First embodiment. By performing these steps, a Cu wiring structure can be formed in which the air gap 280 shown in FIG. 10C is formed.

In the third embodiment, the barrier metal film 242 is self-formed. Accordingly, the following effect is further obtained in addition to the effects of the first embodiment.

FIGS. 11A and 11B are drawings for describing the states of the formation of the seed film in the third embodiment.

FIG. 11A shows an example of the formation of the seed film 250 after the barrier metal film 240 is formed. In this example, it is necessary to form the films twice: specifically, the barrier metal film 240, and the seed film 250. When the scaling down of the fabrication of the wiring is advanced, the upper portion of the opening may be covered before the seed film 250 is formed on the side walls of the opening as shown in FIG. 11A. On the other hand, FIG. 11B shows an example of the self-formation of the barrier metal film 242 after the seed film 252 is formed. In this case, it is only necessary to form the seed film 252 only. Therefore, even if the wiring width is reduced, the thickness can be reduced as compared to the case where the films need to be formed twice. Accordingly, a film can be formed on the inner walls of the opening before the upper portion thereof is covered, as shown in FIG. 11B.

Fourth Embodiment

A fourth embodiment is explained with reference to FIGS. 12-15B.

In the first to third embodiments described above, the formation of the opening for removing the sacrificial film utilizing the erosion resulting from the CMP is described. In the fourth embodiment, the formation of an opening for removing a sacrificial film by performing a lithography process and etching process will be described.

Figure 12:
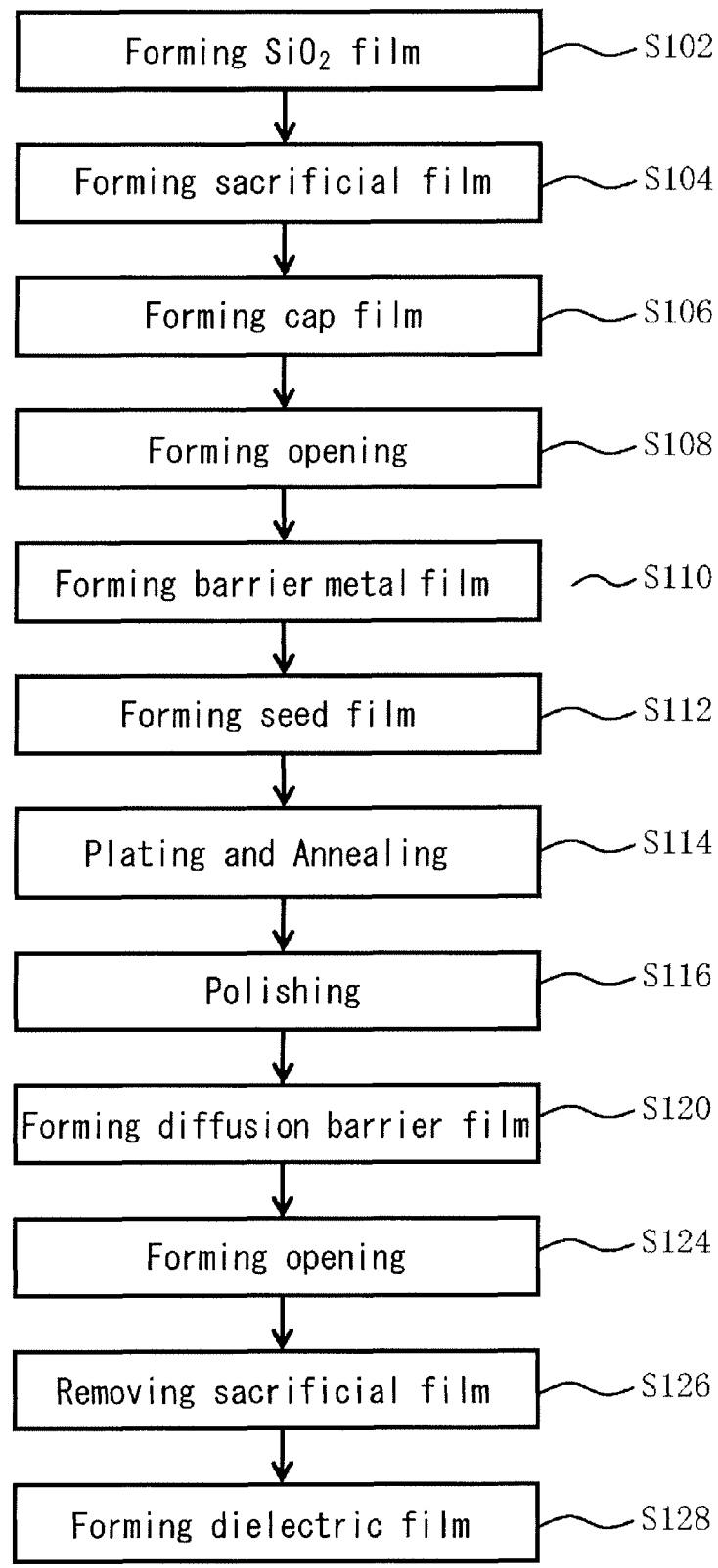
FIG. 12 is a flowchart showing the main part of a method of fabricating a semiconductor device in The fourth embodiment.
Figure 13:
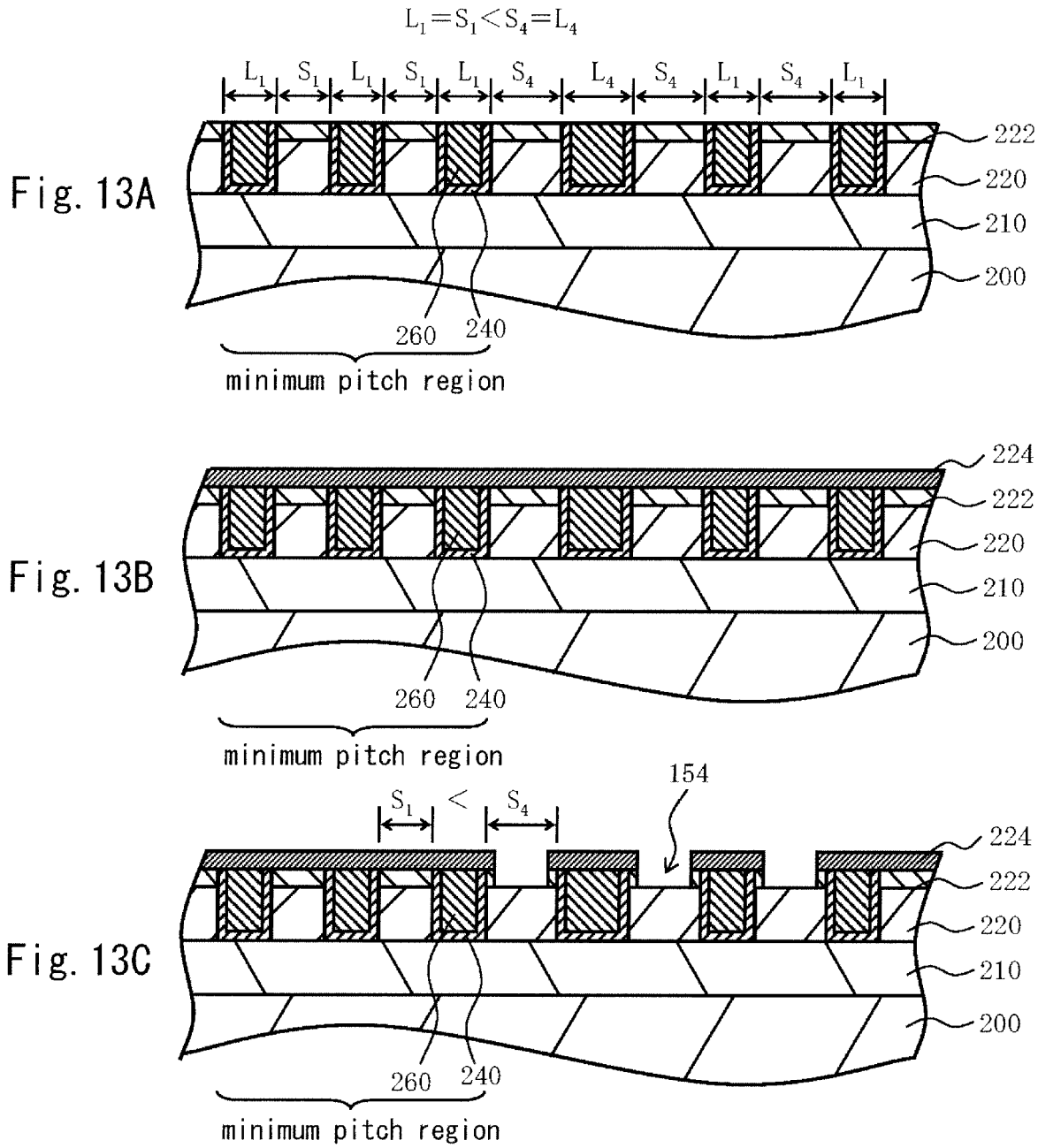
FIGS. 13A to 13C are cross-sectional views showing the steps corresponding to those in the flowchart of FIG. 12.

FIG. 12 is a flowchart showing the main part of a method of fabricating a semiconductor device in the fourth embodiment.

FIG. 12 is the same as FIG. 1 except that the sacrificial film removing step (S118) and the insulating film forming step (S122) are eliminated, and that an opening forming step (S124), a sacrificial film removing step (S126) and an insulating film forming step (S128) are added after the diffusion barrier film forming step (S120). Thus, the steps from the SiO2 film forming step (S102) to the plating-annealing step (S114) are the same as those in First embodiment.

FIGS. 13A to 13C are cross-sectional views showing the steps corresponding to those in the flowchart of FIG. 12.

FIGS. 13A to 13C show the steps from the polishing step (S116) to the opening forming step (S124) in FIG. 12.

FIG. 13A shows the polishing step. In this step, the surface of the substrate 200 is polished with the CMP method applying the polishing load P thereby to remove the Cu film 260 including the seed film 250 and the barrier metal film 240, which are deposited on the surface other than the area of the opening, and which serve as a wiring layer. In the fourth embodiment, a wiring structure is formed so that the line (wire) width L1 and the space width S1 can be provided at the minimum dimensional pitch ratio of 1:1 in the dimension of a desired pattern in the minimum pitch region. Then, a region having a space width S4 larger than the space width S1 is formed in a region which is different from the minimum pitch region. FIG. 13A shows an example in which the wirings respectively having the line widths L1 and L4, which sandwich a space having a space width S4 in between are formed. In the example shown in FIG. 13A, the line width L4 and space width S4 are equal to each other in the region where a wiring pitch L4+S4 is larger than one in the minimum dimension region. Consequently, the coverage of the wiring does not exceed 50% in any of the regions, thus making it possible to prevent the erosion. In other words, the sacrificial film 220 is not exposed after polishing step is performed. As a result, the planarization can be accomplished by polishing. Thus, a damascene wiring can be formed.

FIG. 13B shows the diffusion barrier film forming step. In this step, the diffusion barrier film 224 is formed on the resulting substrate 200 with the CVD method. By forming the diffusion barrier film 224 on the Cu film 260, the Cu can be prevented from diffusing to an insulating film on the top thereof.

FIG. 13C shows the opening forming step. In this step, an anisotropic etching method is performed on the substrate 200 having a resist pattern formed on the diffusion barrier film 224 through an unillustrated resist coating process and lithography process such as an exposure process. Thereby, the exposed diffusion barrier film 224 and the SiOC film 222 located therebelow are removed in the insulating film region having the space width S4. As a result, an opening 154 extending toward the surface of the substrate 200 can be formed approximately vertically on the surface of the sacrificial film 220. The opening 154 may be formed by using, for example, a reactive ion etching method.

Figure 14:
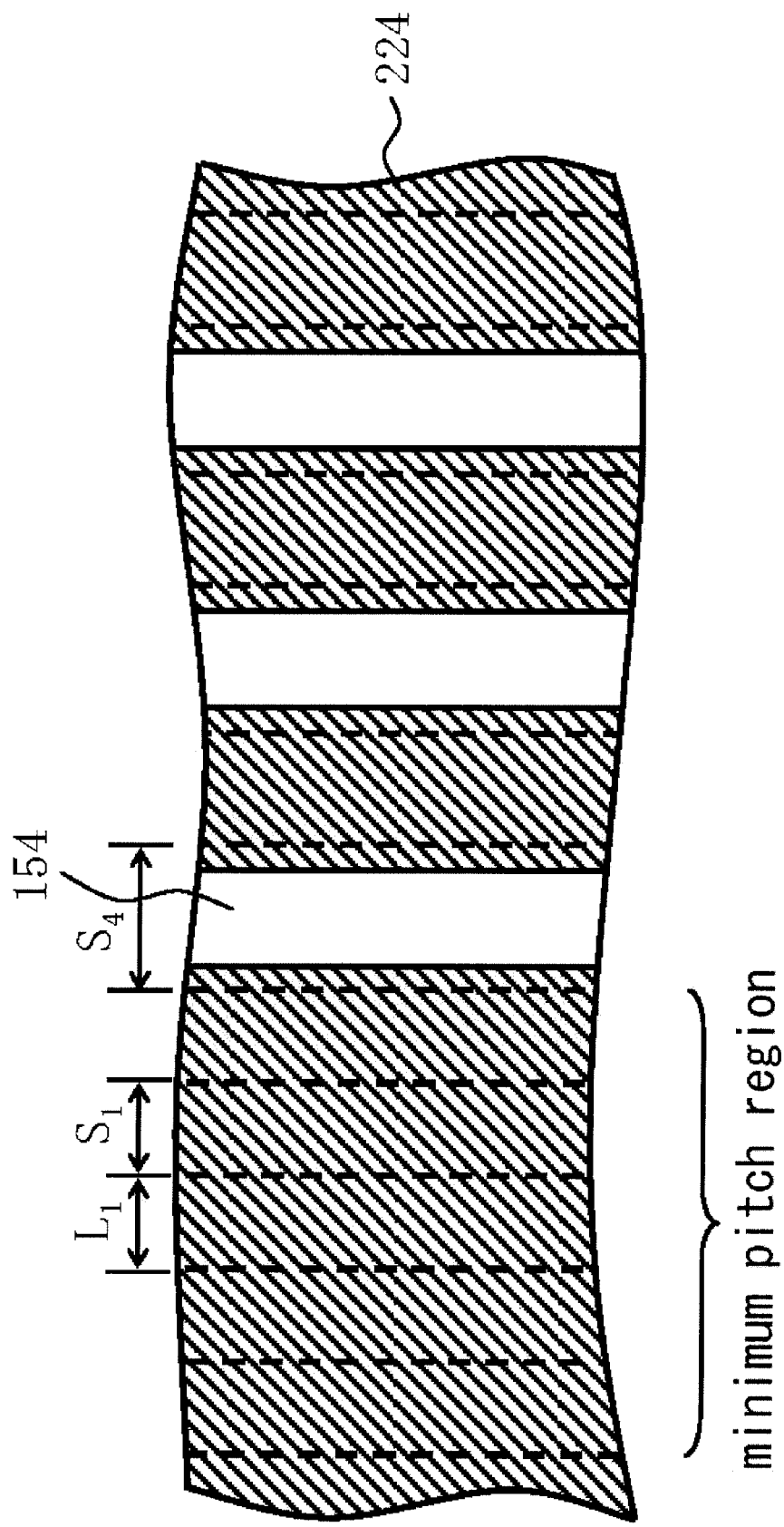
FIG. 14 is a top view of an example of the semiconductor device in which the opening in The fourth embodiment is formed.

FIG. 14 is a top view of an example of the semiconductor device in which the opening in the fourth embodiment is formed.

For example, when the line width L1 and the space width S1 are formed in the minimum dimensions allowing lithographic manufacturing, it is difficult to form the opening 154 in the insulating film region having the space width S1 taking the displacement of the pattern into consideration. Thus, by making pattern in a region having the space width S4 which is larger than the space width S1, it is possible to avoid the misalignment of the pattern, and to form the opening 154. The opening is preferably formed in an insulating film region having a width of, for example, 50 nm or more. The opening is preferably formed in a region having the space width S4 larger than the space S1 particularly in the technological generation of the wiring width rule requiring an air gap. Consequently, the sacrificial film 220 is removed from the opening 154 thus formed. As the opening 154, a trench having, for example, a rectangular opening is here formed. However, the opening 154 is not limited to this. For example, a hole having a circular or oval opening may be formed. As for the circular or oval opening, the multiple holes are preferably formed.

Figure 15A:
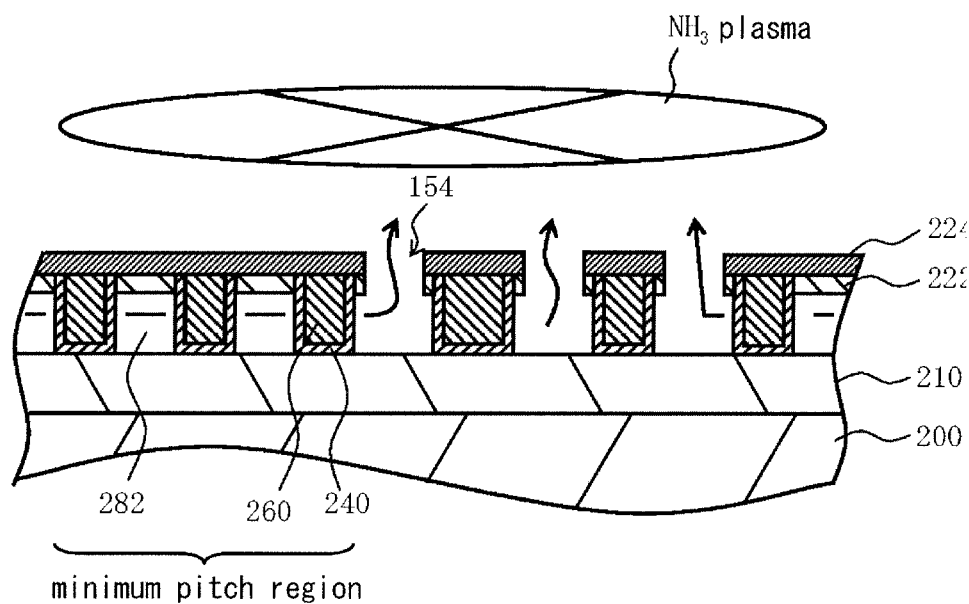
FIGS. 15A and 15B are cross-sectional views showing the steps corresponding to those in the flowchart of FIG. 12.
Figure 15B:
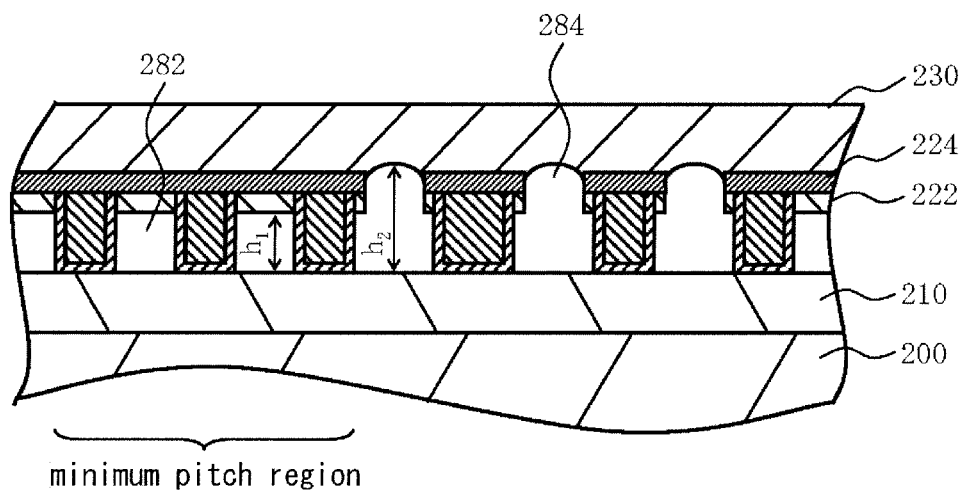

FIGS. 15A and 15B are cross-sectional views showing the steps corresponding to those in the flowchart of FIG. 12.

FIGS. 15A and 15B show the steps of the sacrificial film removing step (S126) and the insulating film forming step (S128) in FIG. 12.

FIG. 15A shows the sacrificial film removing step. In this step, the substrate 200 on which the sacrificial film 220 exposed in the region different from the minimum pitch region is exposed to an ammonia ($NH_3$) plasma atmosphere. The sacrificial film 220 is thereby removed via the opening 154 formed in the region having the space width S4 larger than minimum space width S1. As a result, an air gap 282 is formed under the SiOC film 222 which serves as a cap film. In this respect, in performing the plasma treatment, oxygen ($O_2$) plasma or nitrogen ($N_2$)/hydrogen ($H_2$) plasma may be preferably used in place of the $NH_3$ plasma, as in the first embodiment. It is only necessary to form an atmosphere capable of removing the sacrificial film 220. If the wiring pattern is laid out so that radicals activated by the plasma can run round the sacrificial film 220 located in various positions, the sacrificial film 220 located in a region apart from the opening 154 can be removed. In other words, it is preferable to lay out the wiring pattern in which the sacrificial film 220 is not completely cut off by the wiring material from the position of the opening. In such a way, the removal is initiated at the opening 154. Thus, the sacrificial film 220 formed in the minimum pitch region can be removed.

The SiOC film 222 is connected to and supported by the wirings from the sides of each of the wirings. Here, the SiOC film 222 is connected to the upper side surfaces of the barrier metal film 240. Accordingly, the SiOC film 222 functions as a protection film, and maintains the cavities therebelow. Moreover, the SiOC film 222 functions as the protection film, and the diffusion barrier film 224 prevents the Cu from diffusing. Accordingly, the cap film and the diffusion barrier film 224 may be films which are not removed together with the sacrificial film 220. Alternatively, an inorganic insulating film having a large etching selectivity relative to the sacrificial film 220 may be used in order to facilitate etching control in forming the opening 154. For this reason, in the fourth embodiment, for example, $SiO_2$, SiOC, silicon nitride (SiN), SiCN, and SiCOH are preferable as the material of the cap film and the diffusion barrier film 224.

FIG. 15B shows the insulating film forming step. In this step, the thin insulating film 230, which serves as an interlayer insulating film on the top layer, is formed with a thickness of, for example, 100 nm on the resulting substrate 200 by reducing the coverage with the CVD method. This film can cover (seal) the uppermost part of the opening 154 as a mask for the space of the opening 154. The film is here preferably formed in a vacuum atmosphere of, for example, 10 Pa or more. As the material of the insulating film 230, a porous low dielectric constant insulating material such as $SiO_2$, SiOC, and SiCOH is preferably used.

As described above, by covering the uppermost portion of the opening 154 with the insulating film 230, an air gap 284 can be formed in the position where the opening 154 is formed. The air gap 284 has a height h2 which is larger than a height h1 of the air gap 282 in the minimum pitch region. In the fourth embodiment, the air gaps 282 and 284 which have the different height from each other are formed in the same wiring layer as shown in FIG. 15B. As a result, in particular, the interwiring capacitance of the part of the large gap height can be reduced.

Fifth Embodiment

A fifth embodiment is explained with reference to FIG. 16.

In the fifth embodiment, a configuration in which a film for reinforcing the Cu wiring with no support due to the formation of the air gap is added to the configuration of the fourth embodiment will be described. Steps in a method of fabricating a semiconductor device in the fifth embodiment are the same as those in the fourth embodiment except that the processing conditions of the insulating film forming step (S128) are changed.

Figure 16:
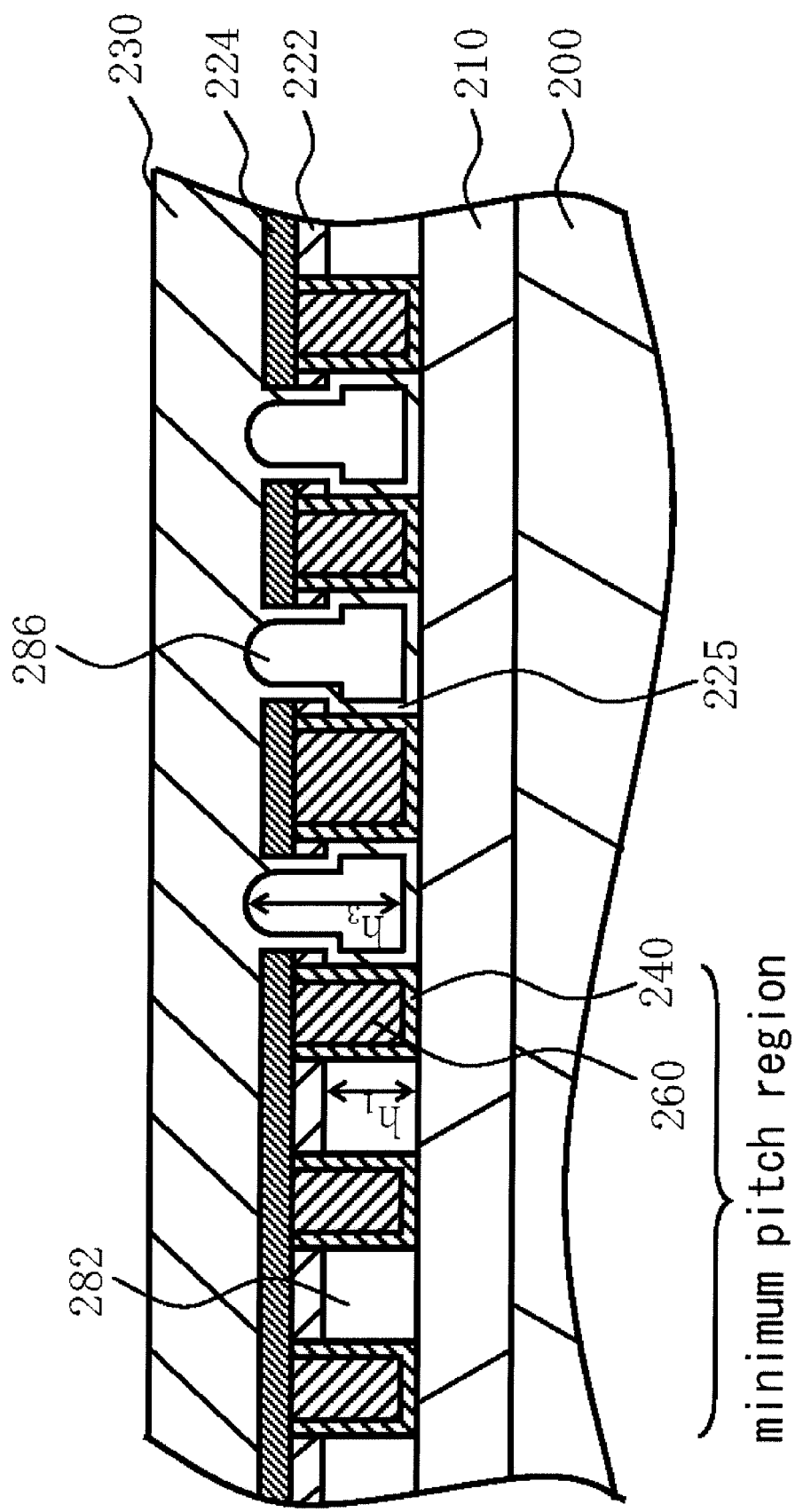
FIG. 16 is a cross-sectional view showing the insulating film forming step (S128) in The fifth embodiment.

FIG. 16 is a cross-sectional view showing the insulating film forming step (S128) in the fifth embodiment.

In forming the insulating film 230 with the CVD method, by increasing the coverage as compared to the fourth embodiment, an insulating film 225 is formed. Specifically, the insulating film 225 is formed on the side surfaces of the diffusion barrier film 224, SiOC film 222, and barrier metal film 240, and on the bottom surface of the space in which the opening 154 is formed. The insulating film 225 is made of the same material as that of the insulating film 230. It is preferable to change, for example, a pressure condition, among the processing conditions in the fourth embodiment, to apply a pressure of 10 Pa or lower. The reducing of the pressure increases the mean free path, allowing the insulating film material to enter the space. As a result, the insulating film 225 can serve as a reinforcing film to reinforce the wiring. In such a manner, an air gap 286 can be formed in the position where the opening 154 is formed. The air gap 286 has a height h3 which is larger than the height h1 of the air gap 282.

Sixth Embodiment

A sixth embodiment is explained with reference to FIGS. 17-18.

In each of the above-described embodiments, as the diffusion barrier film 224 which is formed in the region other than the region on the Cu film 260, an insulating material containing Si is used. The material of the diffusion barrier film is not limited to this. In the sixth embodiment, a configuration in which a diffusion barrier film material is selectively formed on the Cu film 260 will be described.

Figure 17:
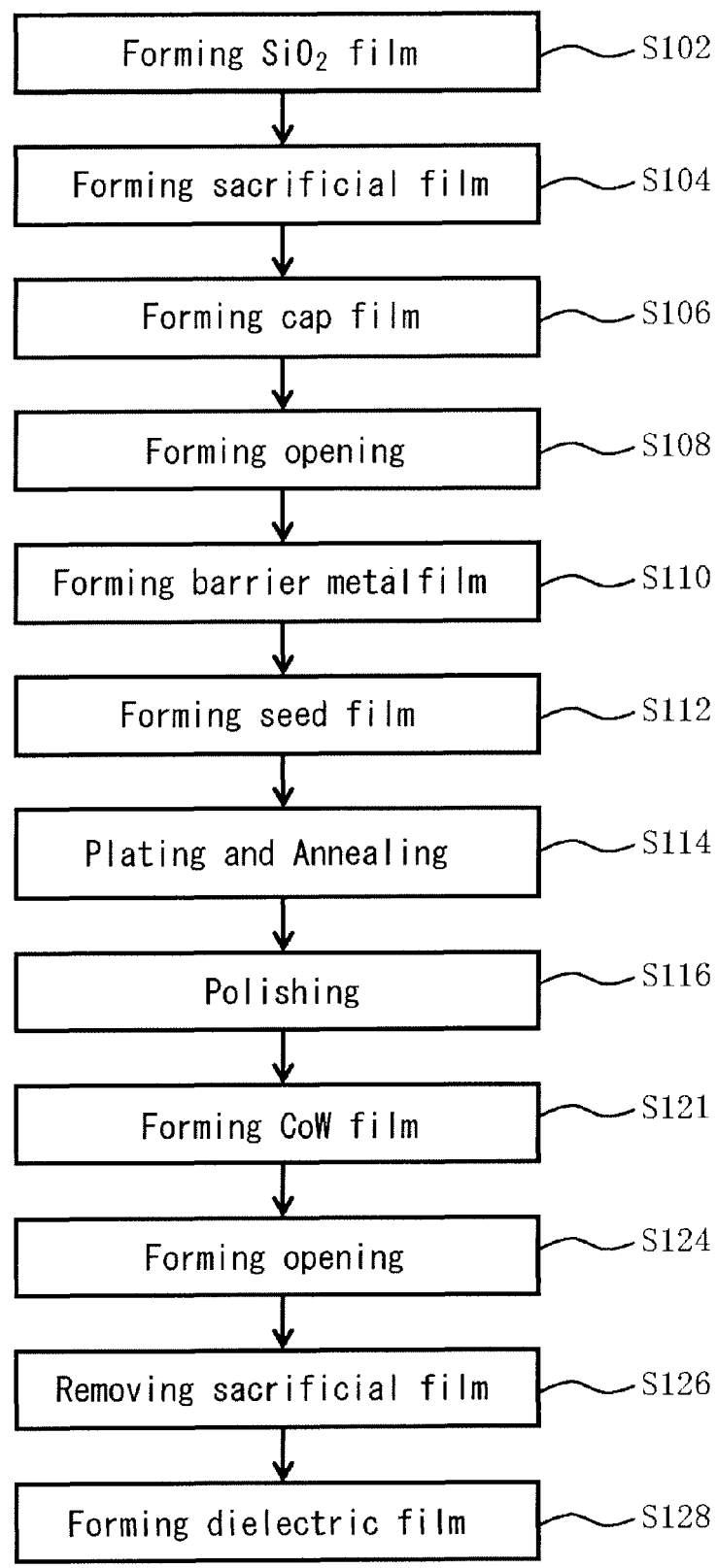
FIG. 17 is a flowchart showing the main part of a method of fabricating a semiconductor device in The sixth embodiment.

FIG. 17 is a flowchart showing a part of a method of fabricating a semiconductor device in the sixth embodiment.

FIG. 17 is the same as those in FIG. 12 except that a cobalt tungsten (CoW) film forming step (S121) is added in place of the diffusion barrier film forming step (S120). Thus, the steps from the SiO2 film forming step (S102) to the polishing step (S116) are the same as those in the fourth embodiment.

Figure 18A:
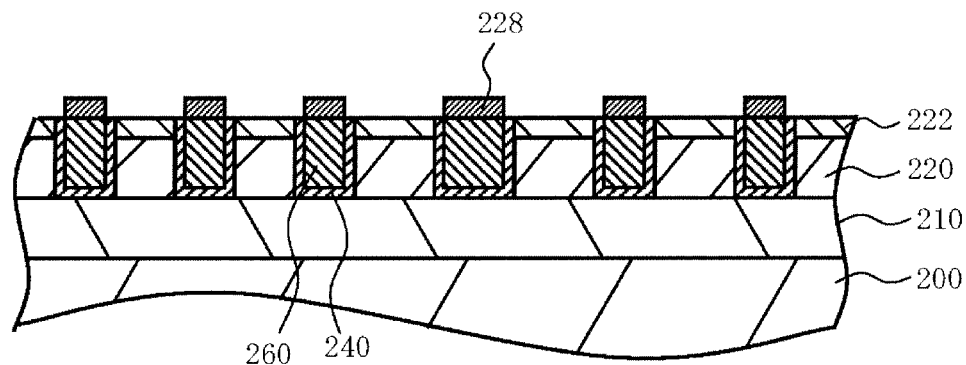
FIGS. 18A to 18C are cross-sectional view showing the steps corresponding to those in the flowchart of FIG. 17.
Figure 18B:
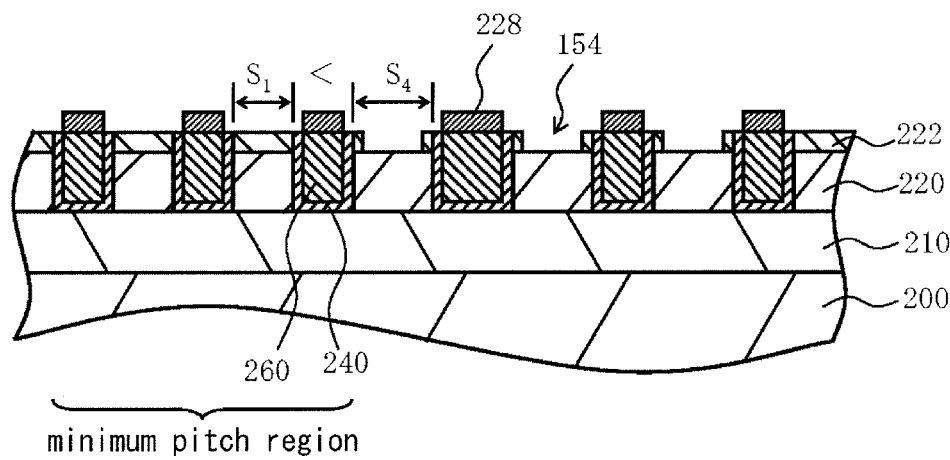
Figure 18C:
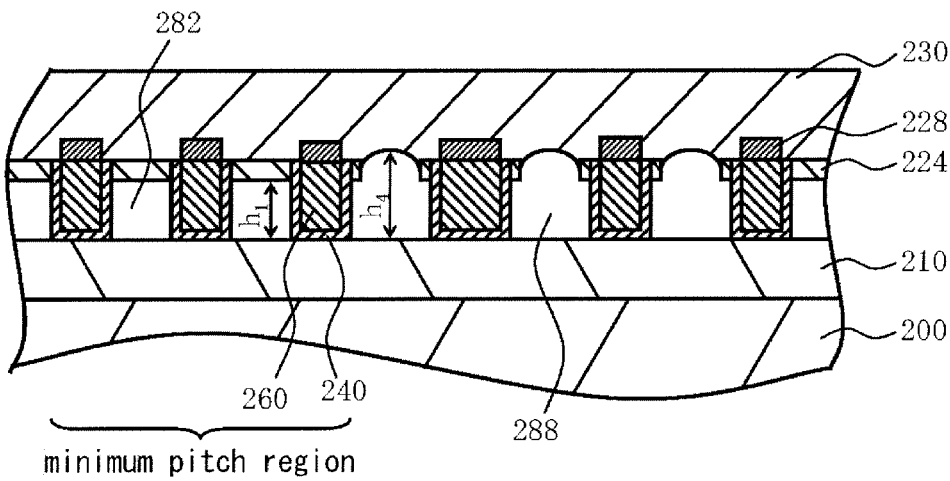

FIGS. 18A to 18C are cross-sectional view showing the steps corresponding to those in the flowchart of FIG. 17.

FIGS. 18A to 18C show the steps from the CoW film forming step (S121) to the opening forming step (S124) in FIG. 17.

FIG. 18A shows the CoW film forming step. In this step, a CoW film 228 is selectively formed on the Cu film 260. For example, the exposed surface of the Cu film 260 is oxidized as a Cu-oxidizing step. Thereafter, the CoW film 228 is selectively grown by substituting the oxidized layer on the surface of the Cu film 260 for cobalt (Co). Here, the CoW film 228 is formed to have a total thickness of about 10 nm composed of, for example, 3 nm on the Cu wiring side and 7 nm on the upper side. A native oxide film after CMP is also preferably used as a substituting film without lowering the surface of the Cu film 260 by performing the Cu-oxidizing step thereto. The diffusion of the Cu can be prevented by selectively growing the CoW film 228 on the exposed surface of the Cu film 260.

FIG. 18B shows the opening forming step. In this step, an anisotropic etching method is performed on the substrate 200 having a resist pattern formed on the SiOC film 222 through an unillustrated resist coating process and lithography process such as an exposure process in the insulating film region having the space width S4. Thereby, the exposed SiOC film 222 is removed. As a result, the opening 154 extending toward the surface of the substrate 200 can be formed approximately vertically on the surface of the sacrificial film 220. The opening 154 may be formed by using, for example, a reactive ion etching method.

Subsequently, the series of steps from the sacrificial film removing step (S126) to the insulating film forming step (S128) are performed as in the fourth embodiment. By performing these steps, as shown in FIG. 18C, an air gap 288 can be formed in the position where the opening 154 is formed. The air gap 288 has a height h4 which is larger than the height h1 of the air gap 282.

Seventh Embodiment

A seventh embodiment is explained with reference to FIG. 19.

In the seventh embodiment, a configuration in which a film for reinforcing the Cu wiring with no support due to the formation of the air gap is added to the configuration of the sixth embodiment will be described. Steps in a method of fabricating a semiconductor device in the seventh embodiment are the same as those in the sixth embodiment except that the conditions of the insulating film forming step (S128) are changed.

Figure 19:
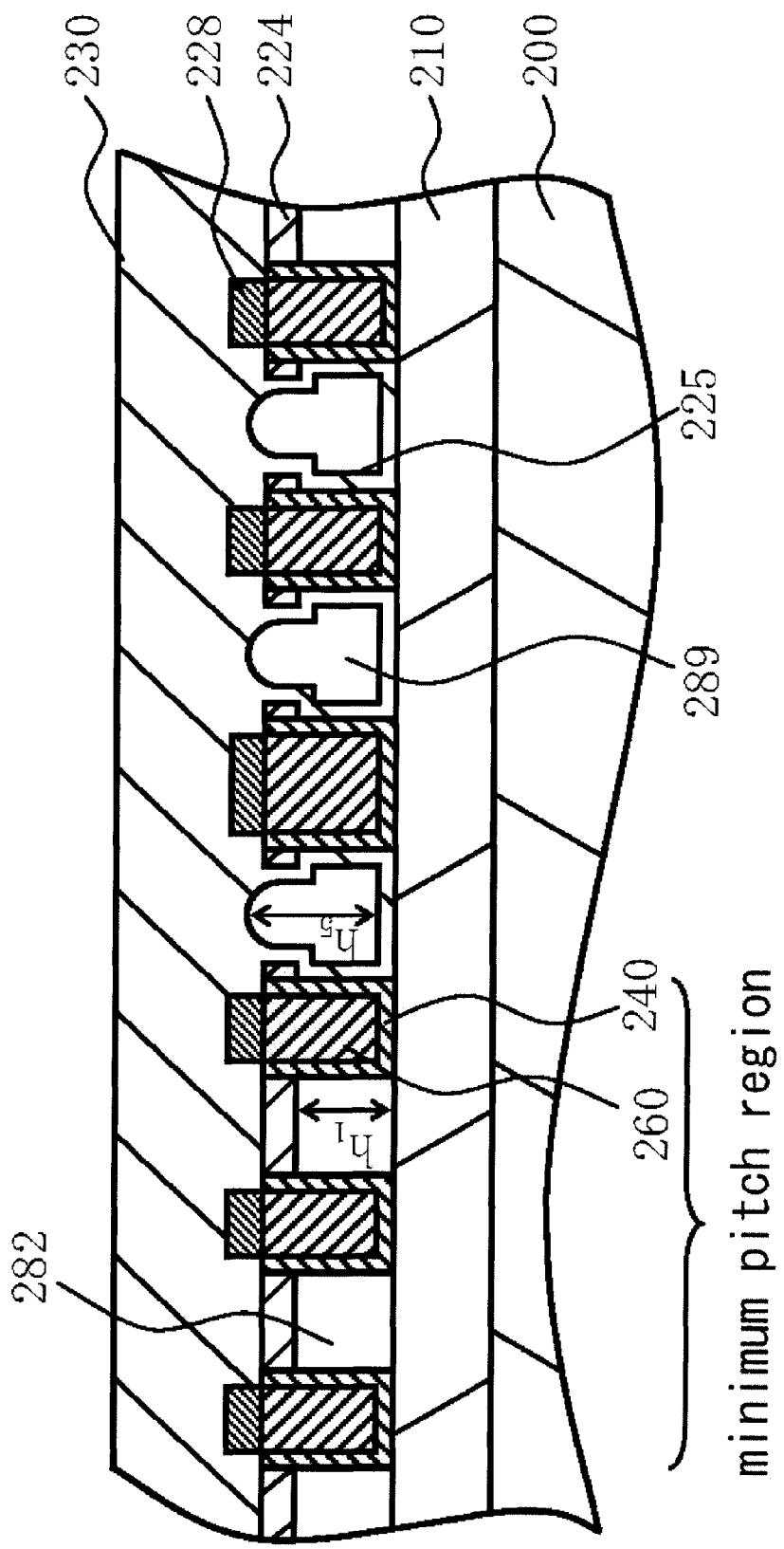
FIG. 19 is a cross-sectional view showing the insulating film forming step (S128) in The seventh embodiment.

FIG. 19 is a cross-sectional view showing the insulating film forming step (S128) in the seventh embodiment.

In forming the insulating film 230 with the CVD method, by increasing the coverage as compared to the sixth embodiment, the insulating film 225 is formed on the side surfaces of the SiOC film 222 and the barrier metal film 240, and on the bottom surface of the space in which the opening 154 is formed. The insulating film 225 is made of the same material as that of the insulating film 230. It is preferable to change, for example, a pressure condition, among the processing conditions in the sixth embodiment, to apply a pressure of 10 Pa or lower. As a result, the insulating film 225 can serve as a reinforcing film to reinforce the wiring. In such a manner, an air gap 289 can be formed in the position where the opening 154 is formed. The air gap 289 has a height h5 which is larger than the height h1 of the air gap 282.

Embodiments of the invention have been described with reference to the examples. However, the invention is not limited thereto.

Even when a material which contains Cu as the main component such as a Cu—Sn alloy, Cu—Ti alloy and Cu—Al alloy, and which is used in a semiconductor industry, is used as the material of the wiring layer in each of the above-described embodiments, the same effects in the above descriptions are obtained.

The processes generally used in a semiconductor industry, such as a photolithography process and cleaning processes before and after the steps, are omitted in the above descriptions for the simplicity of the descriptions. However, it goes without saying that these processes are included in the present invention.

In one aspect of the invention, a semiconductor device may include a plurality of wirings, a first insulating film which has an opening formed in a predetermined region of an area including the plurality of wirings, and which is located on vacancies while being connected to and supported by the plurality of wirings from the sides of each of the wirings, the predetermined region being different from a minimum dimension region where a pitch of the wiring is minimum, and a second insulating film which is disposed on the first insulating film, and which covers the upper portion of the opening.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A method of fabricating a semiconductor device, comprising:
    forming a sacrificial film on or above a substrate;
    forming an insulating film on the sacrificial film;
    forming a plurality of first openings in the sacrificial film and the insulating film in a first region and a second region;
    depositing a conductive material in the plurality of the first openings;
    polishing the conductive material and the insulating film with a chemical mechanical polishing method to form a second opening in the insulating film in the second region so as to expose the sacrificial film while not forming an opening in the insulating film in the first region; and
    removing the sacrificial film in the first region via the second opening in the second region.

2. A method of fabricating a semiconductor device of claim 1, wherein a width of the second opening in the first region is greater than a width of the first opening in the first region.

3. A method of fabricating a semiconductor device of claim 1, wherein a space between the first openings in the first region is less than a space between the first openings in the second region.

4. A method of fabricating a semiconductor device of claim 1, wherein a coverage of the conductive material in the second region is more than 50%.

5. A method of fabricating a semiconductor device of claim 1, wherein the second opening is formed by performing a lithography process and an etching process.

6. A method of fabricating a semiconductor device of claim 1, further comprising depositing a CoW on the conductive material before forming the second opening.

7. A method of fabricating a semiconductor device of claim 1, wherein the polishing is provided so as to occur erosion in the second region.

8. A method of fabricating a semiconductor device of claim 1,
    wherein the first region is an actual wiring region and the second region is a dummy region.

9. A method of fabricating a semiconductor device of claim 1, wherein a top surface of the conductive material in the first region is higher than a top surface of the conductive material in the second region.

10. A method of fabricating a semiconductor device of claim 1, wherein a coverage of the conductive material in the second region is more than 50% and a coverage of the conductive material in the first region is substantially equal to 50%.

11. A method of fabricating a semiconductor device of claim 8, wherein the second opening is formed by polishing the conductive material and the insulating film with a chemical mechanical polishing method.

12. A method of fabricating a semiconductor device of claim 1, wherein the space between the first openings is less than the width of the first opening in the second region.

13. A method of fabricating a semiconductor device of claim 1, wherein the space between the first openings in the first region is substantially equal to the width of the first opening in the first region.

14. A method of fabricating a semiconductor device of claim 1, wherein the space between the first openings in the second region is less than the width of the first opening in the second region.

15. A method of fabricating a semiconductor device, comprising:
    forming a sacrificial film on a substrate;
    forming an insulating film on the sacrificial film;
    forming a plurality of first openings in the sacrificial film and the insulating film in a first region and a second region;
    depositing a conductive material in the plurality of the first openings;
    forming a second opening in the insulating film in the second region so as to expose the sacrificial film; and
    removing the sacrificial film in the first region via the second opening in the second region,
    wherein a space between the first openings is less than a width of a first opening in the second region.

16. A method of fabricating a semiconductor device of claim 15, wherein the second opening is formed by polishing the conductive material and the insulating film with a chemical mechanical polishing method.

17. A method of fabricating a semiconductor device, comprising:
    forming a sacrificial film on a substrate;
    forming an insulating film on the sacrificial film;
    forming a plurality of first openings in the sacrificial film and the insulating film in a first region and a second region;
    depositing a conductive material in the plurality of the first openings;
    forming a second opening in the insulating film in the second region so as to expose the sacrificial film by polishing the conductive material and the insulating film with a chemical mechanical polishing method; and
    removing the sacrificial film in the first region via the second opening in the second region,
    wherein a space between the first openings in the first region is substantially equal to a width of a first opening in the first region.

18. A method of fabricating a semiconductor device of claim 17, wherein the space between the first openings in the second region is substantially equal to the width of the first opening in the second region, and
    the space between the first openings in the second region is greater than the space between the first openings in the first region.

19. A method of fabricating a semiconductor device of claim 17, wherein the second opening is formed by polishing the conductive material and the insulating film with a chemical mechanical polishing method.

20. A method of fabricating a semiconductor device, comprising:
    forming a sacrificial film on a substrate;
    forming an insulating film on the sacrificial film;
    forming a plurality of first openings in the sacrificial film and the insulating film in a first region and a second region;

depositing a conductive material in the plurality of the first openings;

forming a second opening in the insulating film in the second region so as to expose the sacrificial film; and removing the sacrificial film in the first region via the second opening in the second region, wherein a space between the first openings in the second region is less than a width of a first opening in the second region.

21. A method of fabricating a semiconductor device of claim 20, wherein the second opening is formed by polishing the conductive material and the insulating film with a chemical mechanical polishing method.

* * * * *